(12) United States Patent
Noda et al.

(10) Patent No.: US 9,997,531 B2
(45) Date of Patent: Jun. 12, 2018

(54) SEMICONDUCTOR MEMORY DEVICE

(71) Applicant: Toshiba Memory Corporation, Minato-ku (JP)

(72) Inventors: Kotaro Noda, Yokkaichi (JP); Kyoko Noda, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 106 days.

(21) Appl. No.: 14/729,544

(22) Filed: Jun. 3, 2015

(65) Prior Publication Data

US 2016/0268266 A1 Sep. 15, 2016

Related U.S. Application Data

(60) Provisional application No. 62/133,022, filed on Mar. 13, 2015.

(51) Int. Cl.
| | |
|---|---|
| *H01L 27/115* | (2017.01) |
| *H01L 27/11582* | (2017.01) |
| *H01L 27/11565* | (2017.01) |

(52) U.S. Cl.
CPC .. *H01L 27/11582* (2013.01); *H01L 27/11565* (2013.01)

(58) Field of Classification Search
CPC ........... H01L 27/1157; H01L 27/11524; H01L 27/11578; H01L 27/11551
See application file for complete search history.

(56) References Cited

U.S. PATENT DOCUMENTS

| | | | |
|---|---|---|---|
| 2008/0157092 A1* | 7/2008 | Arai | H01L 27/115 257/67 |
| 2009/0152618 A1* | 6/2009 | Matsuo | H01L 27/115 257/324 |
| 2010/0171162 A1* | 7/2010 | Katsumata | H01L 27/0688 257/314 |
| 2013/0341699 A1* | 12/2013 | Sato | H01L 29/788 257/316 |
| 2014/0035026 A1 | 2/2014 | Jang et al. | |
| 2014/0073099 A1 | 3/2014 | Park et al. | |
| 2015/0041882 A1 | 2/2015 | Lee et al. | |

\* cited by examiner

*Primary Examiner* — Fernando L Toledo
*Assistant Examiner* — Lawrence-Linh T Nguyen
(74) *Attorney, Agent, or Firm* — Oblon, McClelland, Maier & Neustadt, L.L.P.

(57) ABSTRACT

A semiconductor memory device according to an embodiment comprises: a memory cell array, the memory cell array including: an inter-layer insulating layer and a conductive layer stacked in a stacking direction; a columnar semiconductor layer having a side surface that faces side surfaces of the inter-layer insulating layer and the conductive layer and extending in the stacking direction; and a block insulating layer and a block high-permittivity layer disposed between the columnar semiconductor layer and the conductive layer, the block insulating layer including: a first block insulating film that covers a side surface of the columnar semiconductor layer from a lower surface of the inter-layer insulating layer to an upper surface of the conductive layer in the stacking direction; and a second block insulating film that contacts the first block insulating film and covers at least a side surface and a lower surface of the conductive layer.

20 Claims, 37 Drawing Sheets

324 325 326 327A'

327A

SEMICONDUCTOR MEMORY DEVICE

CROSS-REFERENCE TO RELATED APPLICATIONS

This application is based upon and claims the benefit of priority from the prior U.S. Provisional Application 62/133,022, filed on Mar. 13, 2015, the entire contents of which are incorporated herein by reference.

BACKGROUND

Field

Embodiments of the present invention relate to a semiconductor memory device.

Description of the Related Art

One kind of semiconductor memory device is a flash memory. Generally, a NAND type flash memory in particular is widely used since it is low cost and has a large capacity. Moreover, up to now, many technologies for further increasing the capacity of this NAND type flash memory have been proposed. One such technology is a structure in which memory cells are three-dimensionally disposed.

DETAILED DESCRIPTION

A semiconductor memory device according to an embodiment comprises: a memory cell array, the memory cell array including: an inter-layer insulating layer stacked on a semiconductor substrate; a conductive layer stacked on the inter-layer insulating layer; a columnar semiconductor layer having a side surface that faces side surfaces of the inter-layer insulating layer and the conductive layer and extending in a stacking direction of the inter-layer insulating layer and the conductive layer; and a block insulating layer and a block high-permittivity layer disposed between the semiconductor layer and the conductive layer, the block insulating layer including: a first block insulating film that covers a side surface of the semiconductor layer at least from a lower surface of the inter-layer insulating layer to an upper surface of the conductive layer in the stacking direction; and a second block insulating film that contacts the first block insulating film and covers at least a side surface and a lower surface of the conductive layer.

Semiconductor memory devices according to embodiments will be described below with reference to the drawings.

First Embodiment

First, an overall configuration of a semiconductor memory device according to a first embodiment will be described.

Figure 1:
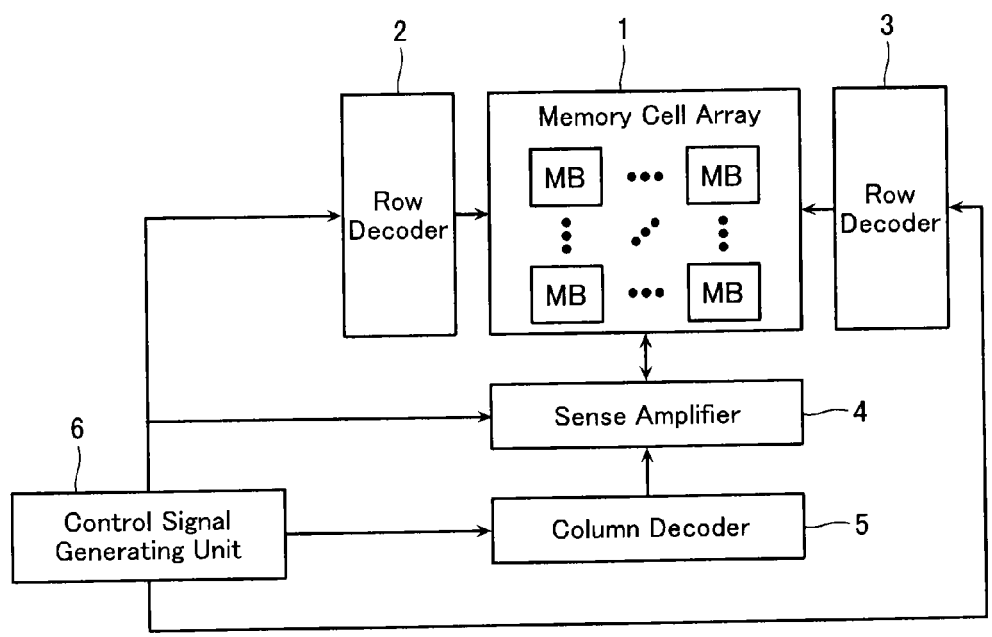
FIG. 1 is a view showing functional blocks of a semiconductor memory device according to a first embodiment.

FIG. 1 is a view showing functional blocks of the semiconductor memory device according to the present embodiment.

The semiconductor memory device according to the present embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC arranged three-dimensionally therein. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a high voltage employed during the write operation or an erase operation, generates a control signal and controls the row decoders 2 and 3, the sense amplifier 4, and the column decoder 5.

Next, a circuit configuration of the memory cell array 1 of the present embodiment will be described.

Figure 2:
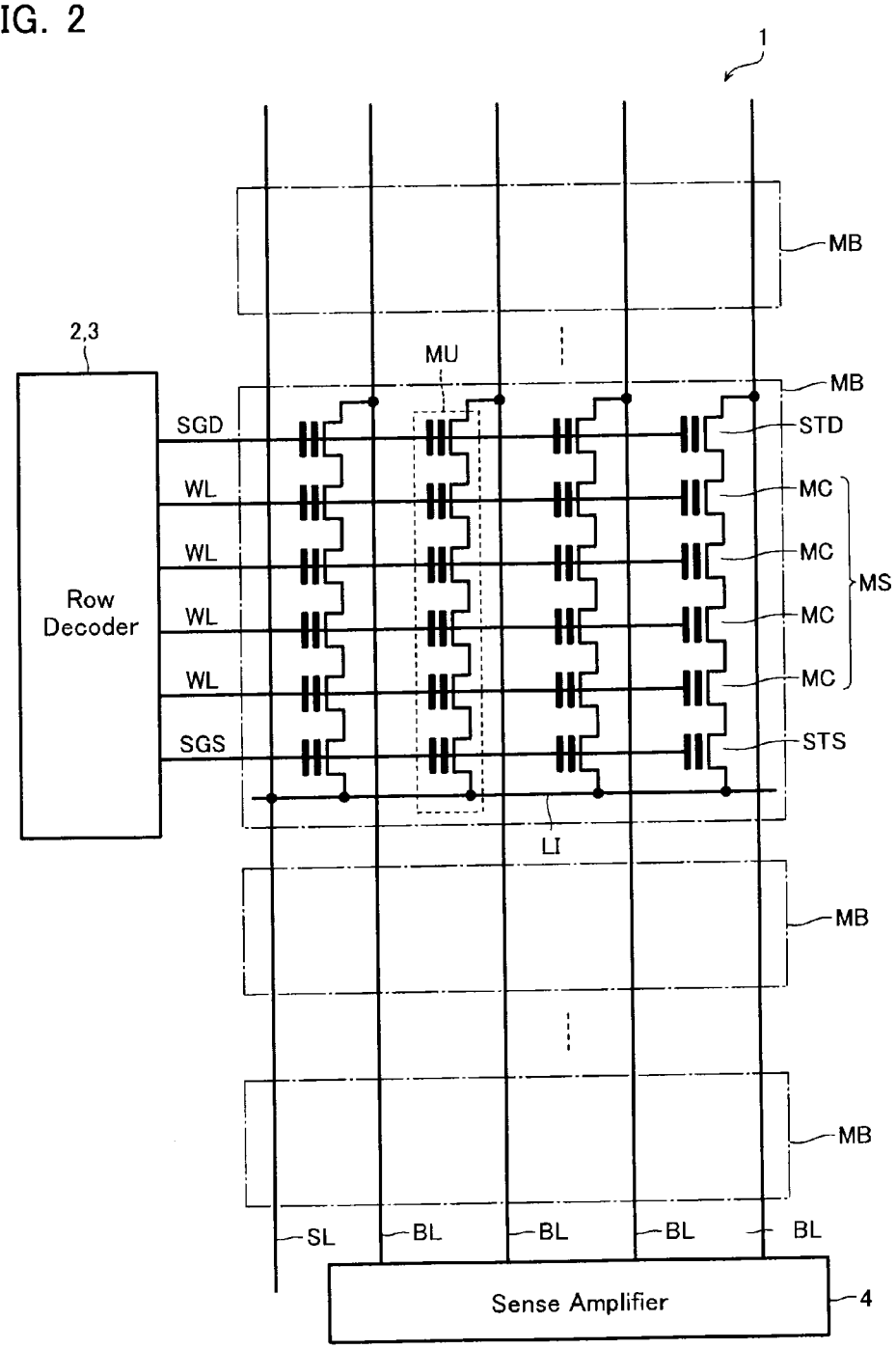
FIG. 2 is an equivalent circuit diagram of a memory cell array in the semiconductor memory device according to the same embodiment.

FIG. 2 is an equivalent circuit diagram of the memory cell array in the semiconductor memory device according to the present embodiment.

As shown in FIG. 2, the memory cell array 1 includes the plurality of memory blocks MB. Commonly connected to these plurality of memory blocks MB are a plurality of bit lines BL and a source line SL. Each of the memory blocks MB is connected to the sense amplifier 4 via the bit line BL, and is connected to an unillustrated source line driver via the source line SL.

The memory block MB includes a plurality of memory units MU that have their one ends connected to the bit line BL and have their other ends connected to the source line SL via a source contact LI. Each of the memory units MU includes: a memory string MS; a source side select transistor STS connected between the memory string MS and the source contact LI; and a drain side select transistor STD connected between the memory string MS and the bit line BL.

The memory string MS includes a plurality of the memory cells MC connected in series. Each of the memory cells MC is a transistor having a semiconductor layer, a charge accumulation layer, and a control gate, and accumulates a charge in the charge accumulation layer based on a voltage applied to the control gate, thereby changing a threshold value of the memory cell MC. Commonly connected to the control gates of a plurality of the memory cells MC belonging to different memory strings MS are, respectively, word lines WL. These plurality of memory cells MC are connected to the row decoder 2 or 3 via the word line WL.

The source side select transistor STS has a control gate to which a source side select gate line SGS is connected. The source side select gate line SGS is connected to the row decoder 2 or 3, and selectively connects the memory string MS and a semiconductor substrate based on an inputted signal.

The drain side select transistor STD has a control gate to which a drain side select gate line SGD is connected. The drain side select gate line SGD is connected to the row decoder 2 or 3, and selectively connects the memory string MS and the bit line BL based on an inputted signal.

Next, a schematic structure of the memory cell array 1 of the present embodiment will be described.

Figure 3:
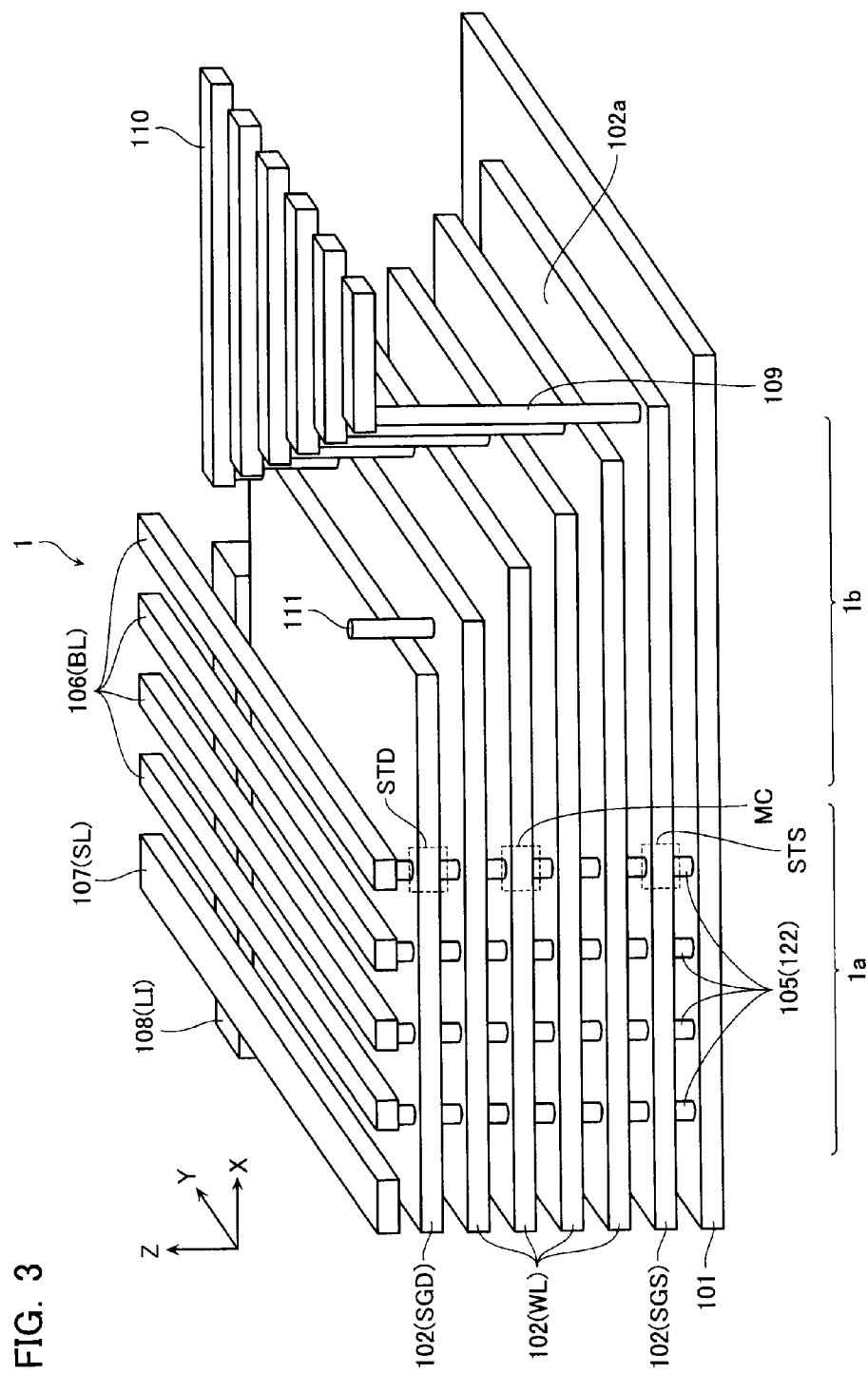
FIG. 3 is a perspective view showing a schematic structure of the memory cell array in the semiconductor memory device according to the same embodiment.

FIG. 3 is a perspective view showing the schematic structure of the memory cell array in the semiconductor memory device according to the present embodiment.

As shown in FIG. 3, the memory cell array 1 includes: a semiconductor substrate 101; and a plurality of conductive layers 102 stacked in a Z direction on the semiconductor substrate 101.

The memory cell array 1 includes a plurality of memory columnar bodies 105 extending in the Z direction. An intersection of the conductive layer 102 and the memory columnar body 105 functions as the source side select transistor STS, the memory cell MC, or the drain side select transistor STD. The conductive layer 102 is formed from the likes of tungsten (W) or polysilicon (Poly-Si), for example, and functions as the source side select gate line SGS, the word line WL, and the drain side select gate line SGD.

In addition, the plurality of conductive layers 102 are formed in steps. That is, a certain conductive layer 102 has a contact portion 102a that does not face a lower surface of another conductive layer 102 positioned in a layer above.

Moreover, the conductive layer 102 is connected to a via 109 at this contact portion 102a. A wiring line 110 is disposed on an upper end of the via 109. Note that the via 109 and the wiring line 110 are formed from the likes of tungsten (W), for example.

In addition, the memory cell array 1 includes a conductive layer 108 that faces side surfaces in a Y direction of the plurality of conductive layers 102 and extends in an X direction. A lower surface of the conductive layer 108 contacts the semiconductor substrate 101. The conductive layer 108 is formed from the likes of tungsten (W), for example, and functions as the source contact LI.

Moreover, the memory cell array 1 includes a plurality of conductive lines 106 and a conductive line 107 that are positioned above the plurality of conductive layers 102 and the memory columnar body 105, are aligned in plurality in the X direction, and extend in the Y direction. The memory columnar bodies 105 are respectively electrically connected to lower surfaces of the conductive lines 106. Note that the conductive line 106 is formed from the likes of tungsten (W), for example, and functions as the bit line BL. The conductive layer 108 is electrically connected to a lower surface of the conductive line 107. Note that the conductive line 107 is formed from, for example, tungsten (W), and functions as the source line SL.

Furthermore, the memory cell array 1 includes a beam columnar body 111. The beam columnar body 111 communicates with holes formed in the plurality of conductive layers 102 and supports a posture of the contact portion 102a of the plurality of conductive layers 102.

Note that hereafter, a region where the plurality of memory columnar bodies 105 are disposed, of the memory cell array 1 will sometimes also be referred to as "memory region 1a", and a region where the contact portion 102a of the plurality of conductive layers 102 is formed, of the memory cell array 1 will sometimes also be referred to as "contact region 1b".

Next, a schematic structure of the memory cell MC of the present embodiment will be described.

Figure 4:
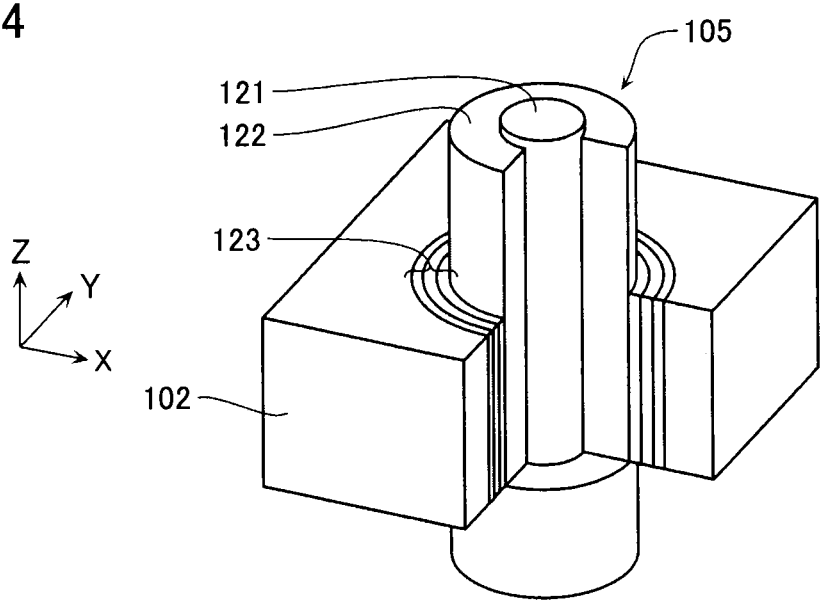
FIG. 4 is a perspective view showing a structure of a memory columnar body and a periphery thereof, of the memory cell array in the semiconductor memory device according to the same embodiment.

FIG. 4 is a perspective view showing the schematic structure of the memory cell in the semiconductor memory device according to the present embodiment. Note that a similar structure to that of FIG. 4 may be adopted also for the source side select transistor STS and the drain side select transistor STD.

The memory cell MC is formed at an intersection of the conductive layer 102 and the memory columnar body 105. The memory columnar body 105 includes: a core insulating layer 121; and a semiconductor layer 122 that covers a side surface of the core insulating layer 121. Moreover, the memory cell array 1 includes a multi-film layer 123 disposed between the semiconductor layer 122 and the conductive layer 102. The multi-film layer 123 includes the following, deposited from the semiconductor layer 122 to the conductive layer 102, namely: a tunnel insulating layer 124; a charge accumulation layer 125; a block insulating layer 126; a block high-permittivity layer 127; and a barrier layer 128. Furthermore, the block insulating layer 126 includes: a first block insulating film 126A that covers an outer side surface of the charge accumulation layer 125; and a second block insulating film 126B that covers an outer side surface of the first block insulating film 126A. Note that in FIG. 4, a structure of the multi-film layer 123 is shown simplified. As will be mentioned later, in the case of the present embodiment, configurations from the core insulating layer 121 to the first block insulating film 126A are included in the memory columnar body 105.

The core insulating layer 121 is formed from the likes of silicon oxide (SiO$_2$), for example. The semiconductor layer 122 is formed from the likes of polysilicon (Poly-Si), for example, and functions as a channel of the memory cell MC, the source side select transistor STS, and the drain side select transistor STD. The tunnel insulating layer 124 is formed from the likes of silicon oxide (SiO$_2$), for example. The charge accumulation layer 125 is formed from a material capable of charge accumulation, such as silicon nitride (SiN), for example. The first block insulating film 126A and the second block insulating film 126B include a silicon oxide film formed from the likes of silicon oxide (SiO$_2$), for example. The block high-permittivity layer 127 is formed from a metal oxide such as alumina (Al$_2$O$_3$) or hafnium oxide (HfO$_x$), for example. The barrier layer 128 is formed from a metal nitride such as titanium nitride (TiN), tungsten nitride (WN), and tantalum nitride (TaN), for example.

Next, the structure of the memory cell array 1 will be described in detail.

Figure 5:
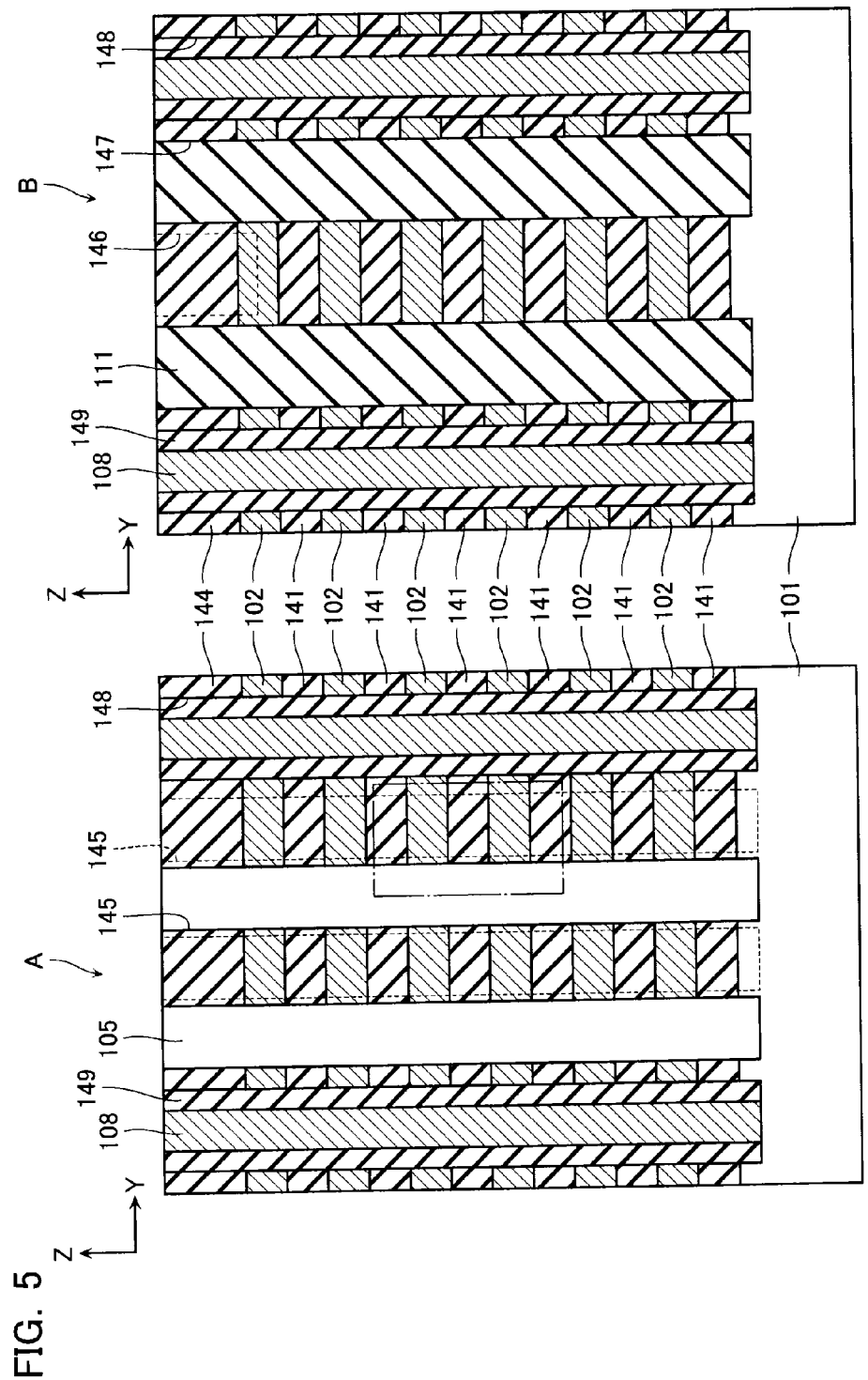
FIGS. 5 and 6 are cross-sectional views of the memory cell array in the semiconductor memory device according to the same embodiment.
Figure 6:
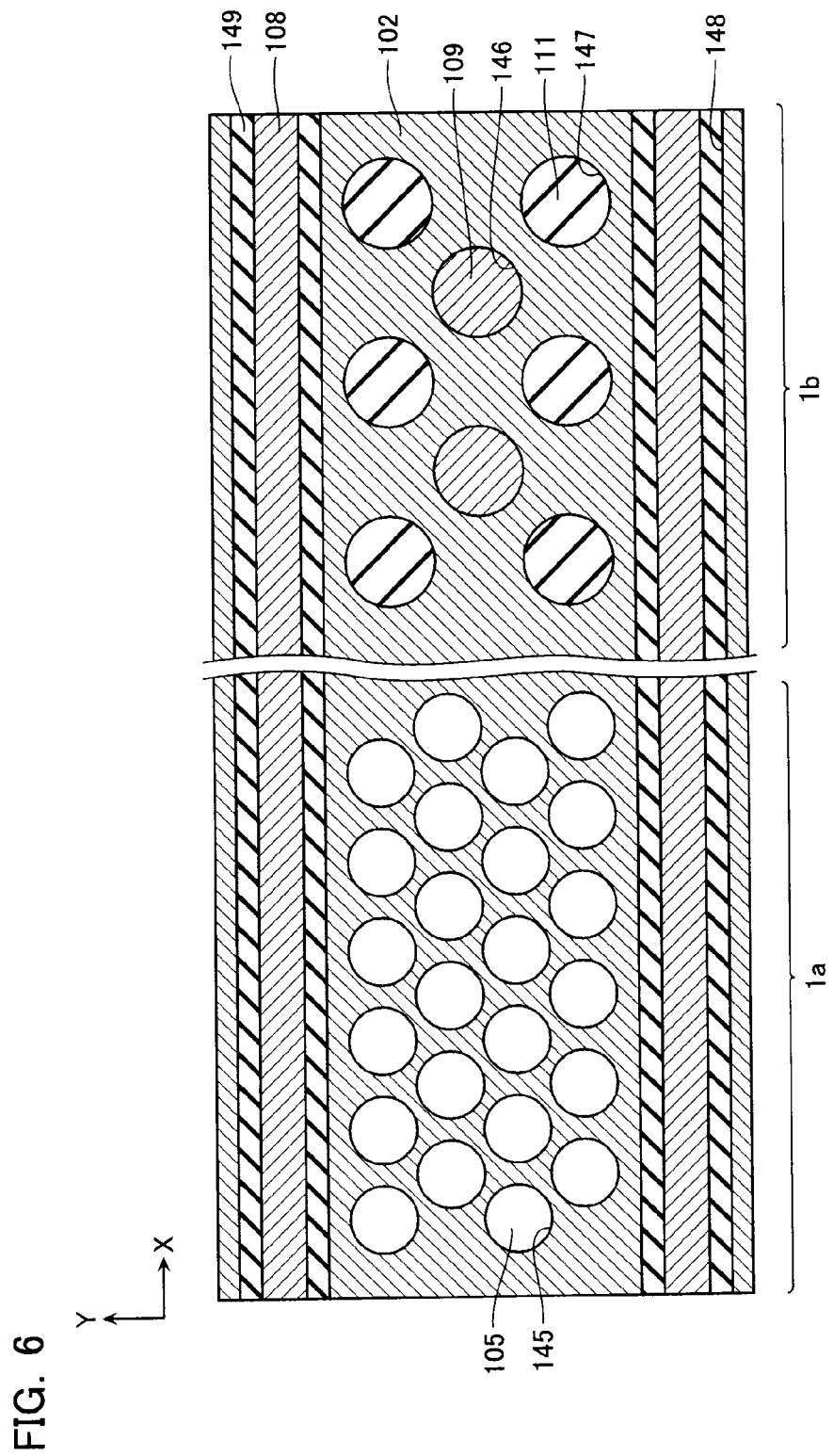

FIGS. 5 and 6 are cross-sectional views of the memory cell array in the semiconductor memory device according to the present embodiment. A in FIG. 5 is a cross-sectional view in the Y-Z directions of the memory region 1a; and B in FIG. 5 is a cross-sectional view in the Y-Z directions of the contact region 1b. Moreover, FIG. 6 is a cross-sectional view in the X-Y directions at a position of the uppermost layer conductive layer 102 in the Z direction.

The memory cell array 1 includes: an inter-layer insulating layer 141 and the conductive layer 102 stacked in plurality alternately on the semiconductor substrate 101; and an inter-layer insulating layer 144 stacked on the conductive layer 102.

The memory region 1a of the memory cell array 1 has formed therein a plurality of memory holes 145 that penetrate in the Z direction from the lowermost layer inter-layer insulating layer 141 to the inter-layer insulating layer 144 and reach an upper portion of the semiconductor substrate 101, and these memory holes 145 are buried with a plurality of the memory columnar bodies 105.

On the other hand, the contact region 1b of the memory cell array 1 has formed therein a plurality of via holes 146 extending in the Z direction from an upper surface of the inter-layer insulating layer 144 to each of the conductive layers 102, and these via holes 146 are buried with a plurality of the vias 109. Moreover, the contact region 1b of the memory cell array 1 has formed therein a plurality of beam holes 147 that penetrate in the Z direction from the inter-layer insulating layer 141 to the inter-layer insulating layer 144 and reach the upper portion of the semiconductor substrate 101, and these beam holes 147 are buried with a plurality of the beam columnar bodies 111. Furthermore, formed in the memory cell array 1 so as to sandwich an arrangement region of the memory columnar body 105, the via 109, and the beam columnar body 111, are a plurality of trenches 148 that have the Z direction as a depth direction and have the X direction as an extension direction. This trench 148 includes the conductive layer 108 disposed via an insulating layer 149. This conductive layer 108 is electrically connected to a source line 107 (not illustrated) disposed on the inter-layer insulating layer 144.

Next, a method of manufacturing the memory cell array 1 will be described. Note that steps from formation of the memory columnar body 105 to formation of the conductive layer 102 will be described in detail later, hence will be explained simply here.

FIGS. 7 to 22 are cross-sectional views explaining manufacturing steps of the memory cell array in the semiconductor memory device according to the present embodiment. A in FIGS. 7, 9, 11, 13, 15, 17, 19, and 21 are cross-sectional views in the Y-Z directions of the memory region 1a; and B in FIGS. 7, 9, 11, 13, 15, 17, 19, and 21 are cross-sectional views in the Y-Z directions of the contact region 1b. FIGS. 8, 10, 12, 14, 16, 18, 20, and 22 are cross-sectional views in the X-Y directions at a position of the uppermost layer conductive layer 102 in the Z direction.

Figure 7:
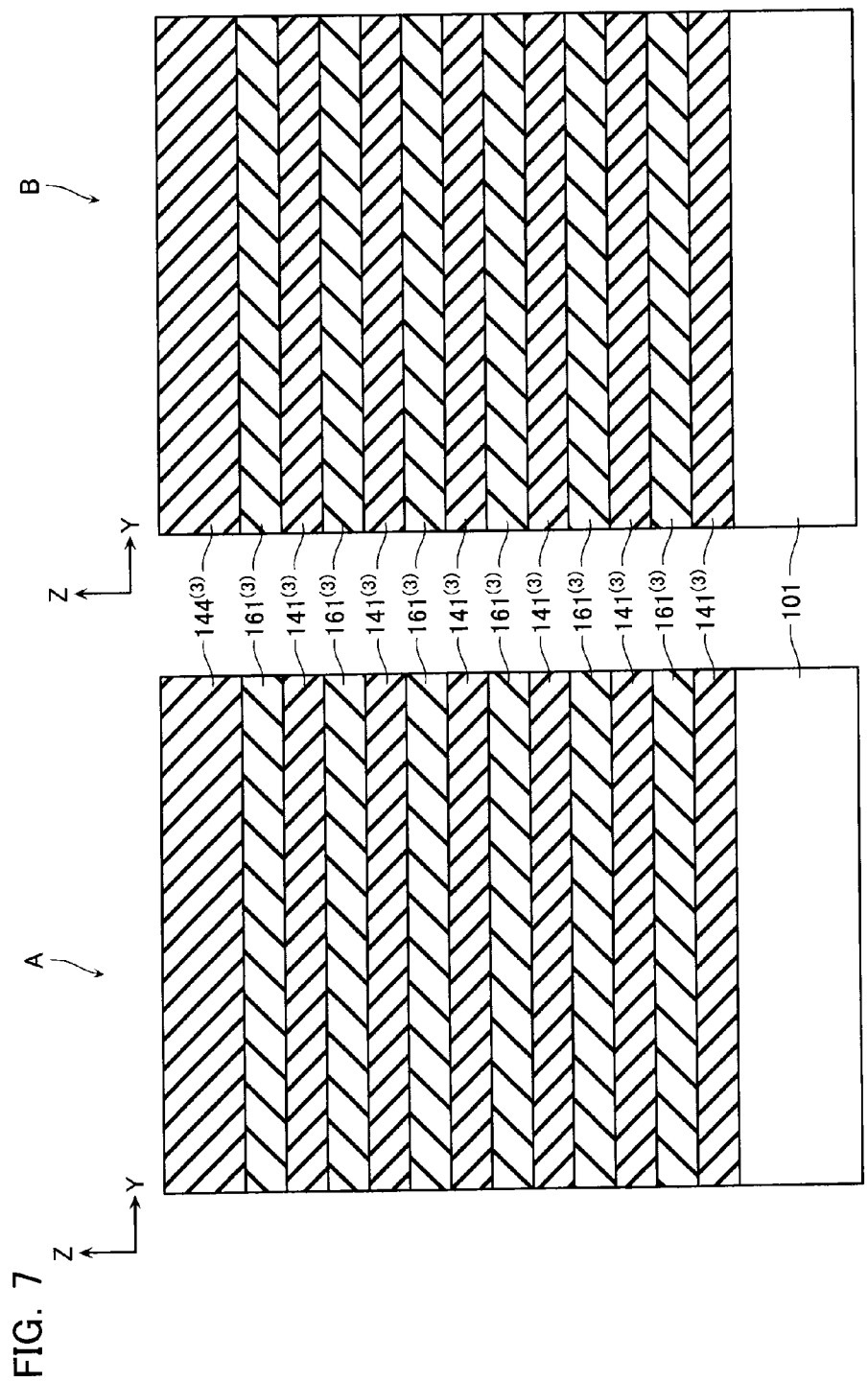
FIGS. 7 to 22 are cross-sectional views explaining manufacturing steps of the memory cell array in the semiconductor memory device according to the same embodiment.
Figure 8:
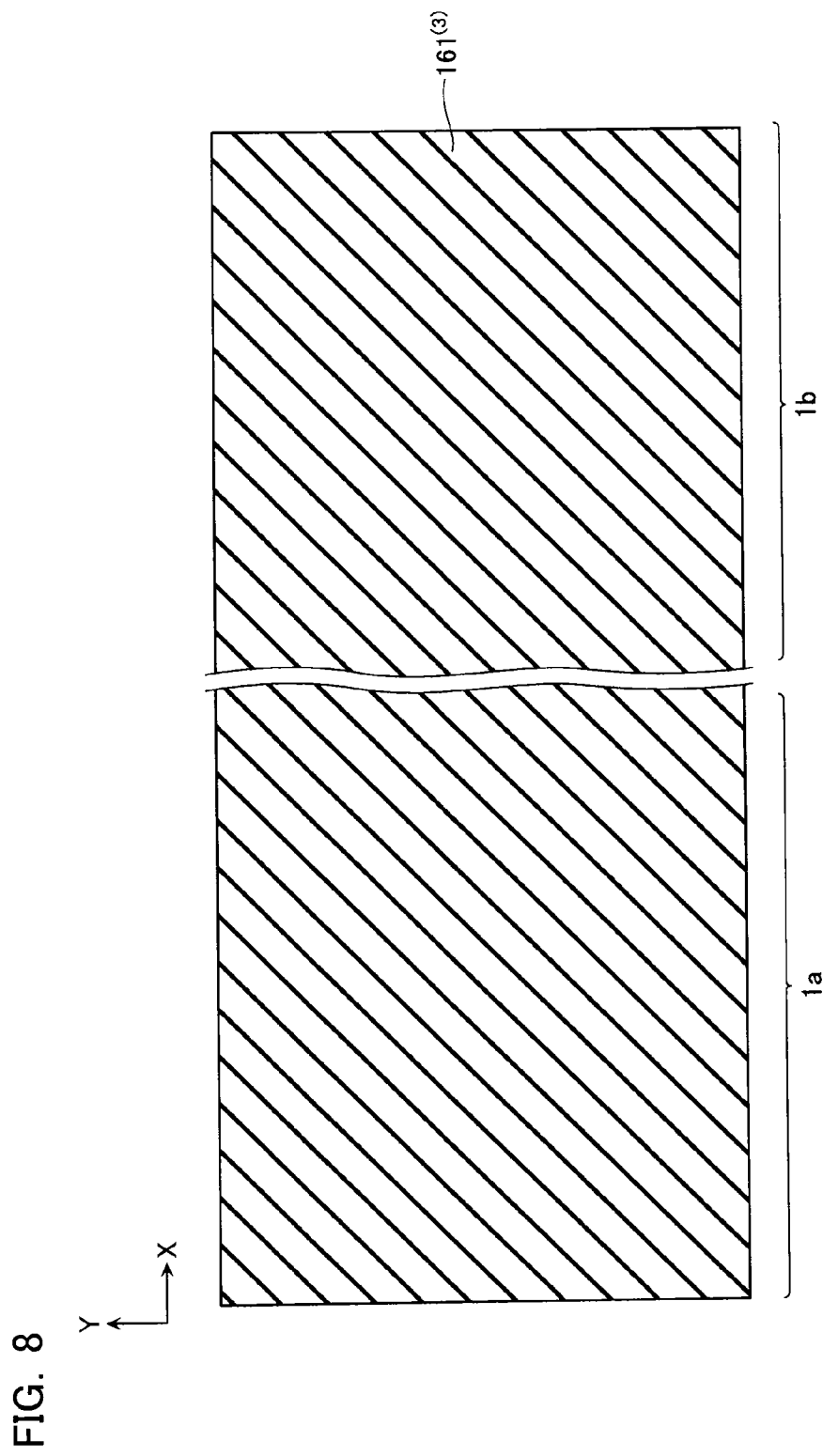

As shown in FIGS. 7 and 8, an inter-layer insulating layer 141$^{(3)}$ and a sacrifice layer 161$^{(3)}$ are stacked in plurality alternately on the semiconductor substrate 101, and an inter-layer insulating layer 144$^{(3)}$ is stacked on the uppermost layer sacrifice layer 161$^{(3)}$. Now, the inter-layer insulating layers 141$^{(3)}$ and 144$^{(3)}$ are formed by the likes of silicon oxide (SiO$_2$), for example. Moreover, the sacrifice layer 161$^{(3)}$ is formed by the likes of silicon nitride (SiN), for example.

Figure 9:
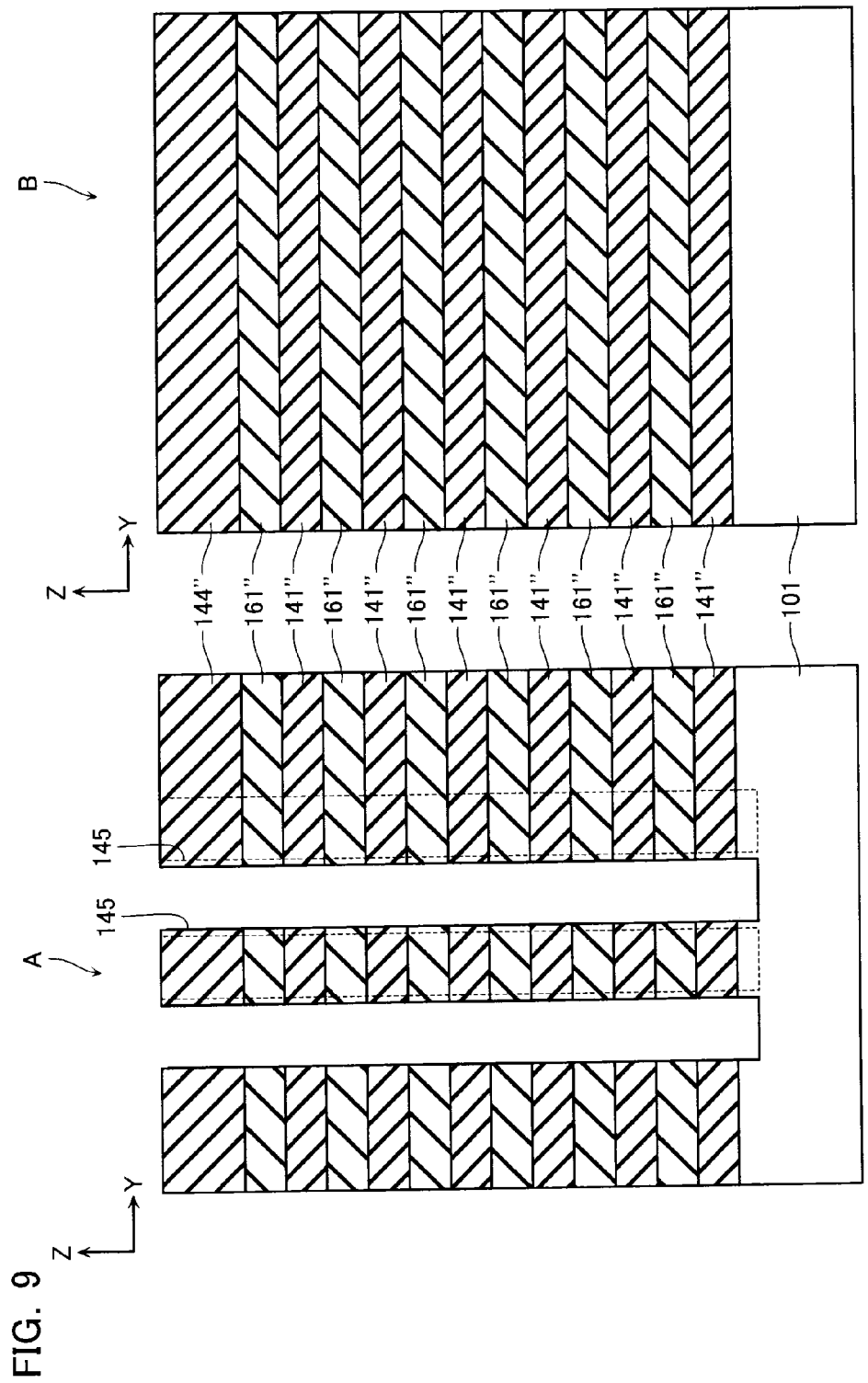
Figure 10:
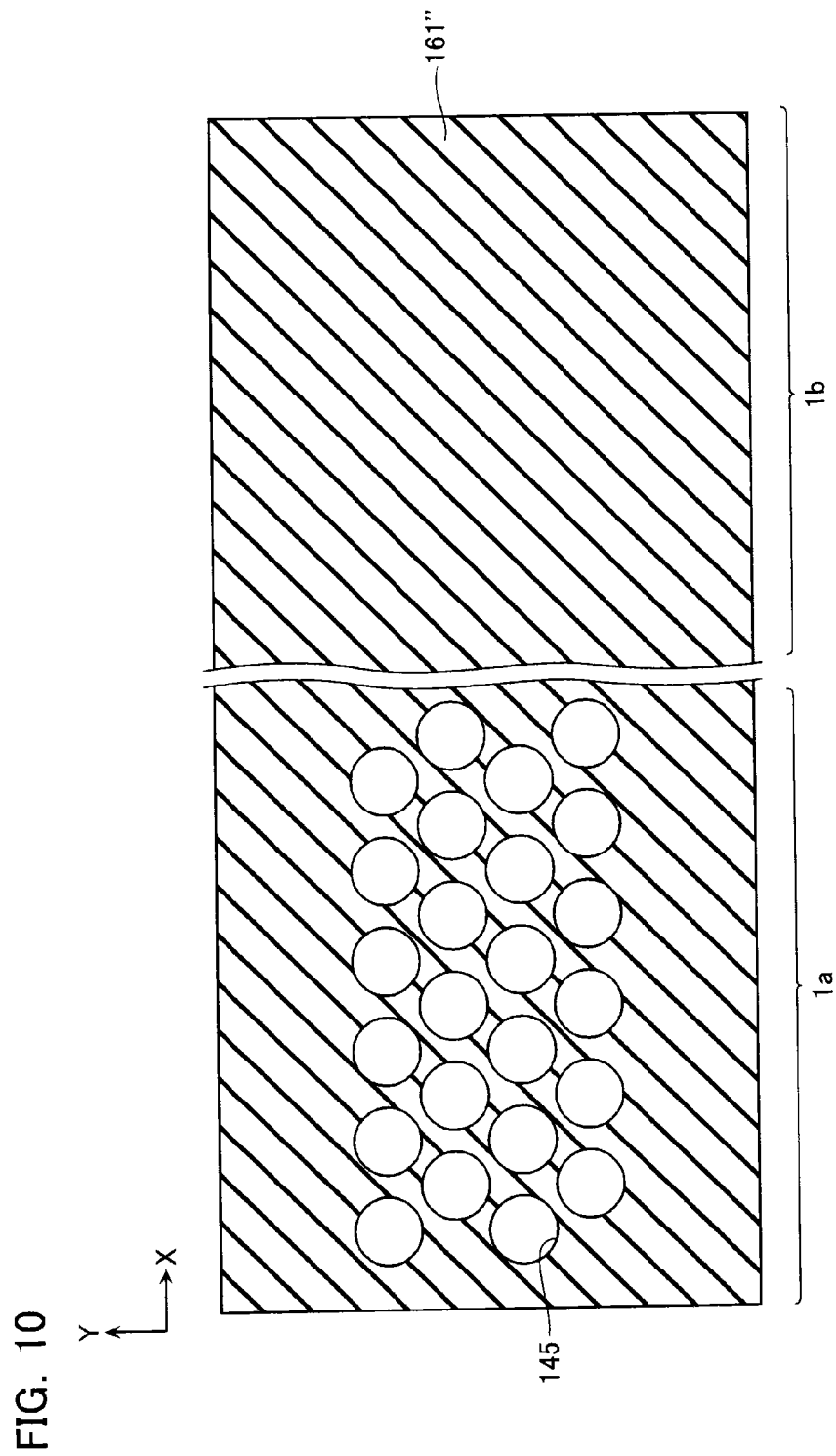

As shown in FIGS. 9 and 10, in the memory region 1a of the memory cell array 1, a plurality of through holes 145 extending in the Z direction are formed in the inter-layer insulating layers 141$^{(3)}$ and 144$^{(3)}$ and the sacrifice layer 161$^{(3)}$. Now, employed in formation of the through hole 145 are, for example, lithography and dry etching. As a result, the inter-layer insulating layers 141$^{(3)}$ and 144$^{(3)}$ and the sacrifice layer 161$^{(3)}$ become inter-layer insulating layers 141" and 144' and a sacrifice layer 161". The through hole 145 becomes the memory hole 145.

Figure 11:
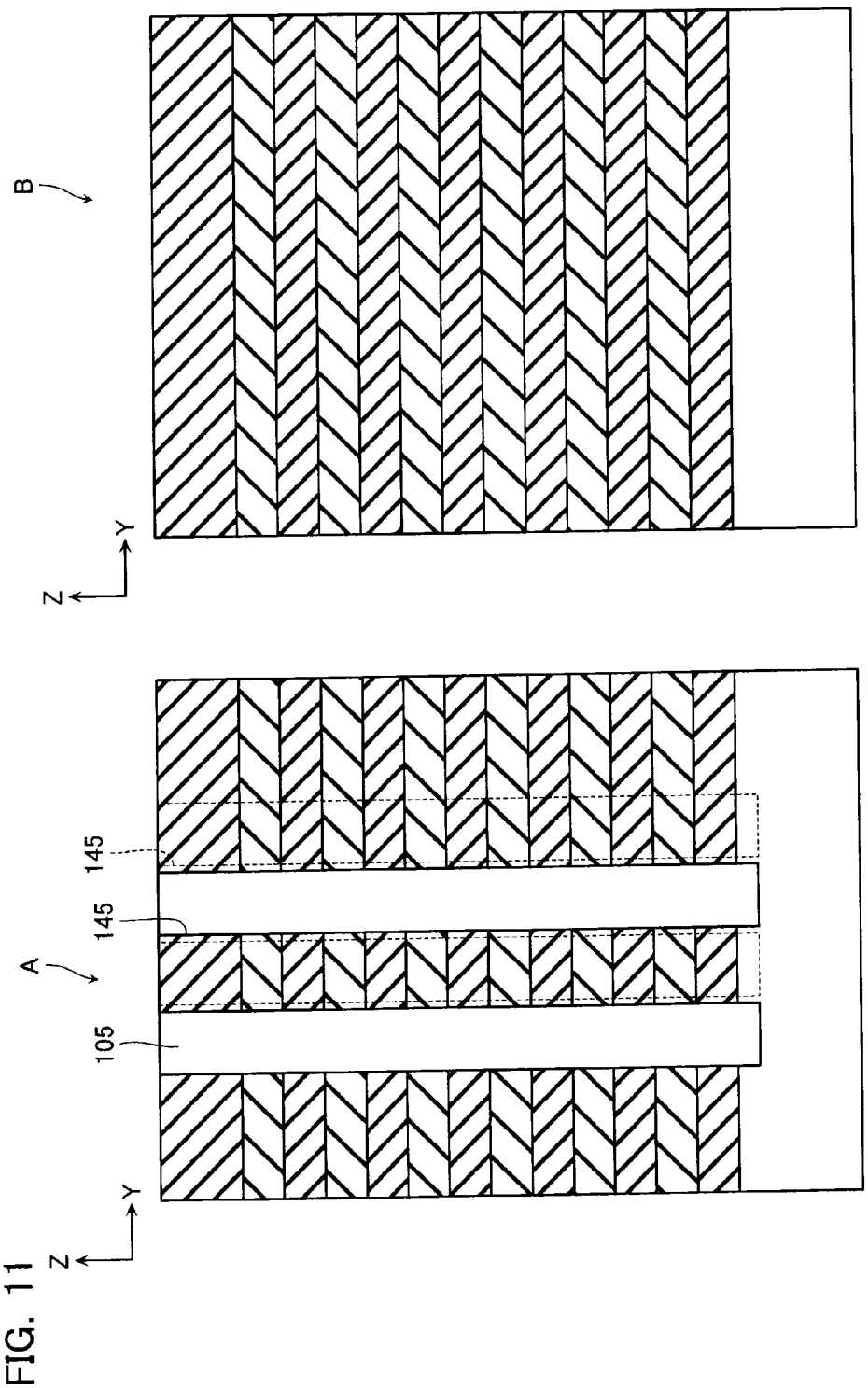
Figure 12:
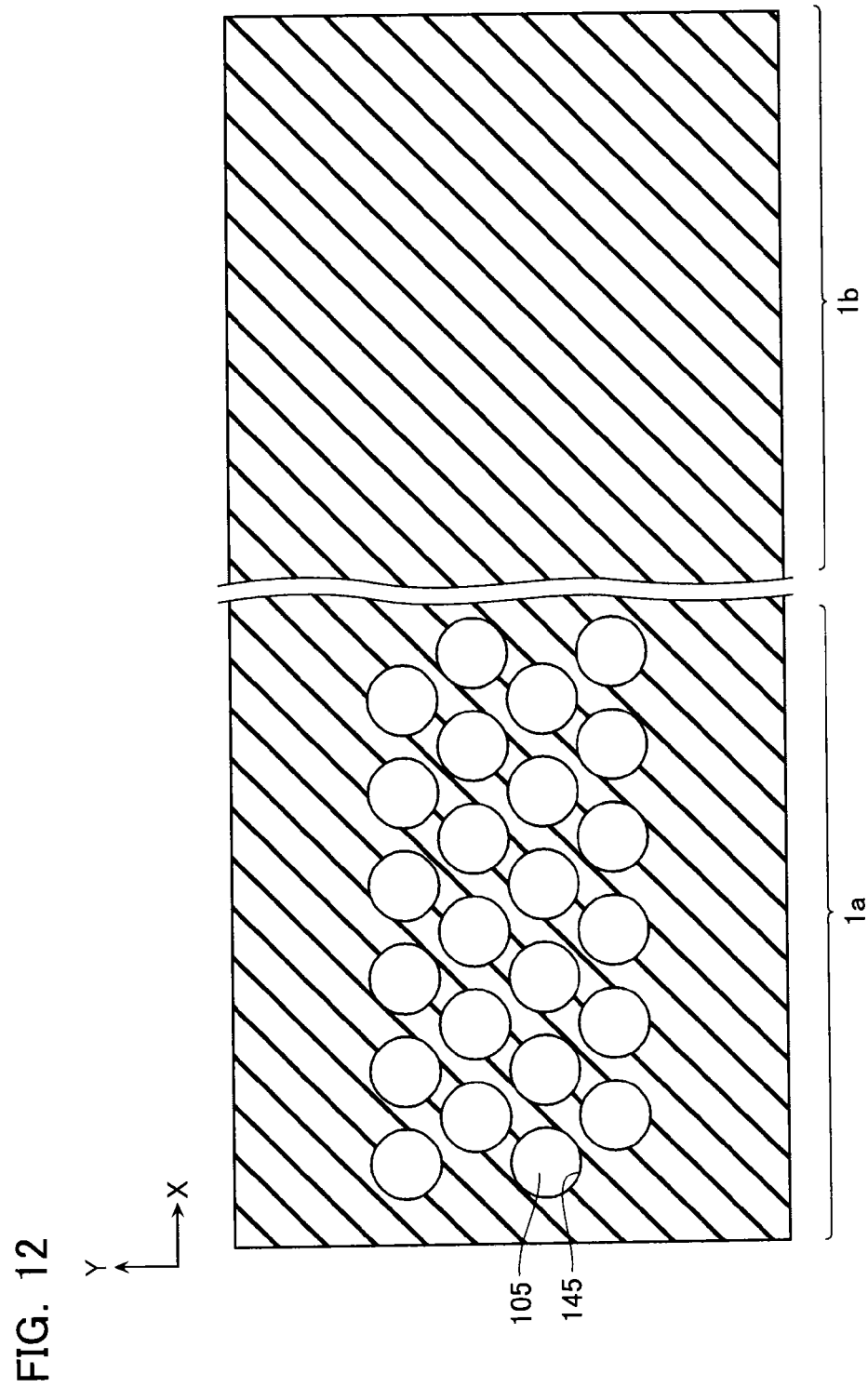

As shown in FIGS. 11 and 12, the through hole 145 is buried with a material of the memory columnar body 105.

Figure 13:
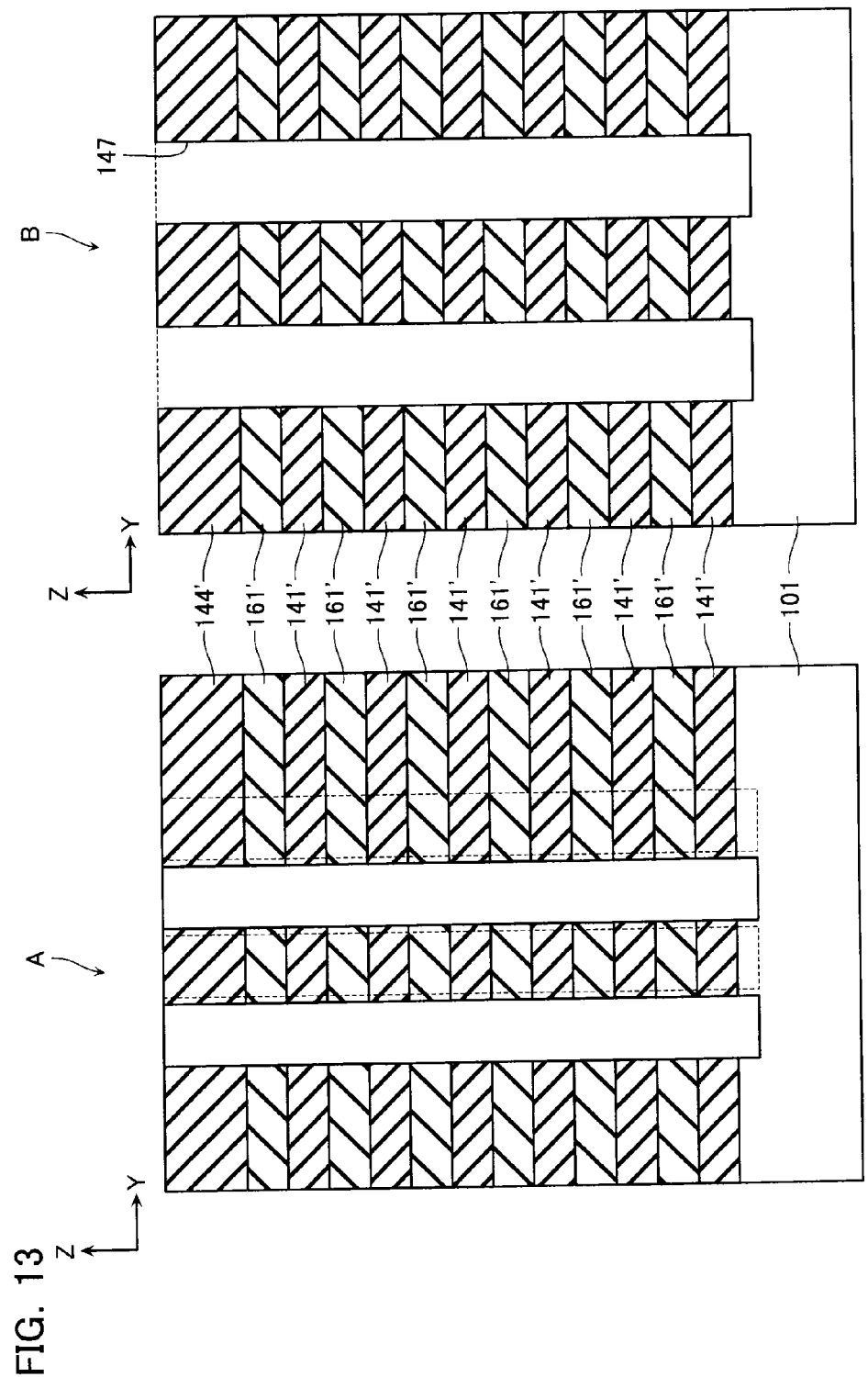
Figure 14:
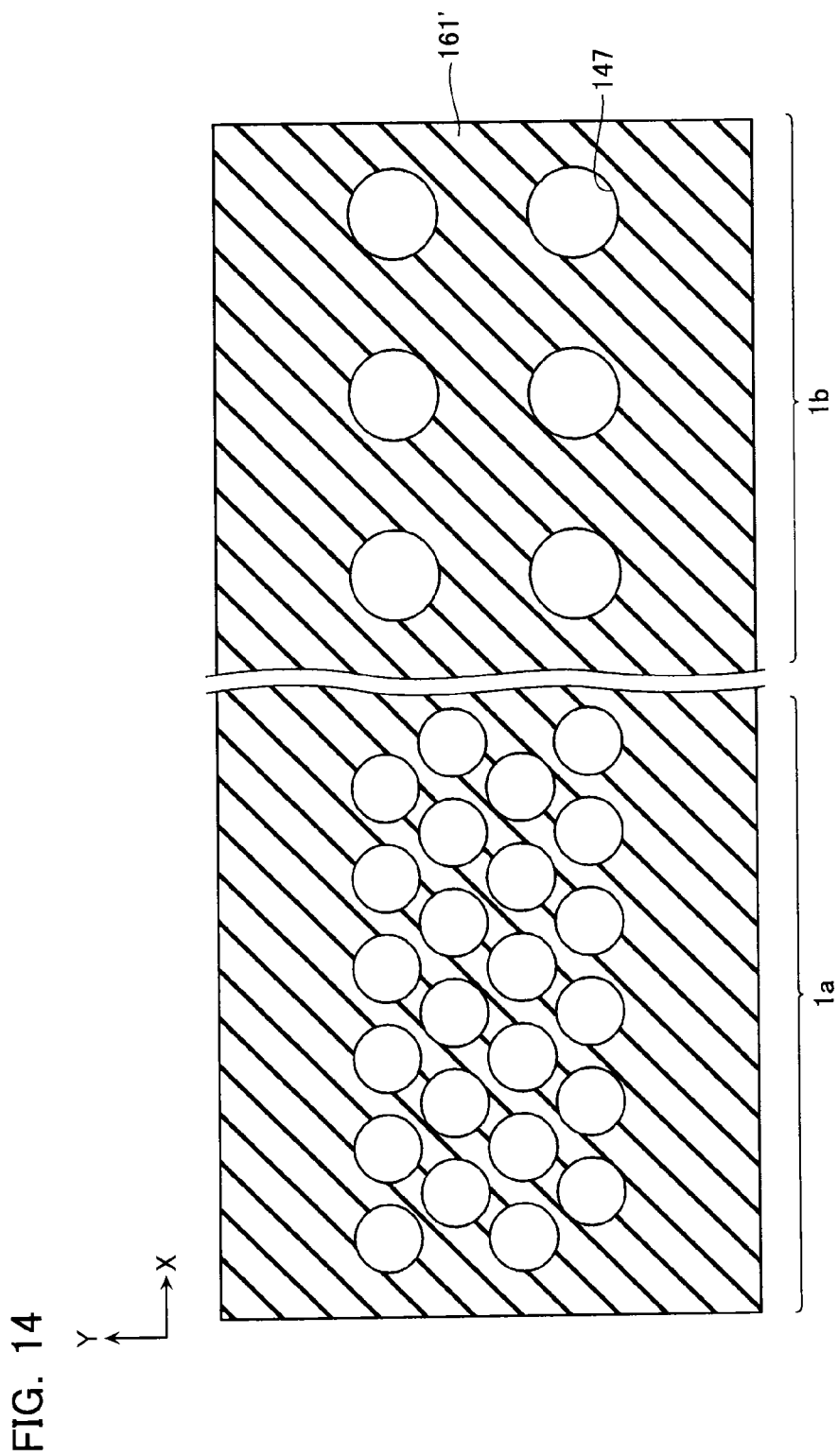

As shown in FIGS. 13 and 14, in the contact region 1b of the memory cell array 1, a plurality of through holes 147 extending in the Z direction are formed in the inter-layer insulating layers 141" and 144" and the sacrifice layer 161". Now, employed in formation of the through hole 147 are, for example, lithography and dry etching. As a result, the inter-layer insulating layers 141" and 144" and the sacrifice layer 161" become inter-layer insulating layers 141' and 144' and a sacrifice layer 161'. The through hole 147 becomes the beam hole 147.

Figure 15:
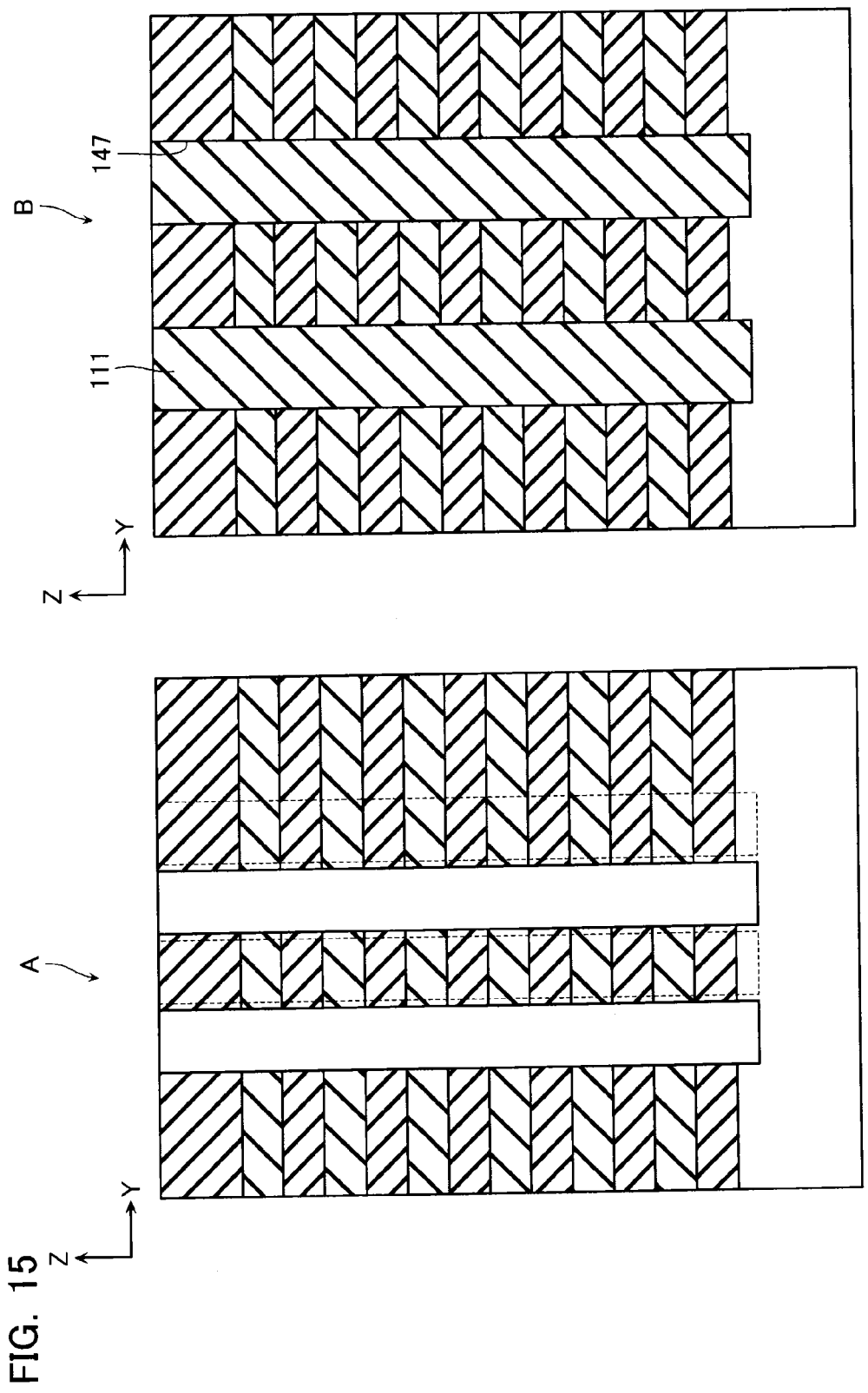
Figure 16:
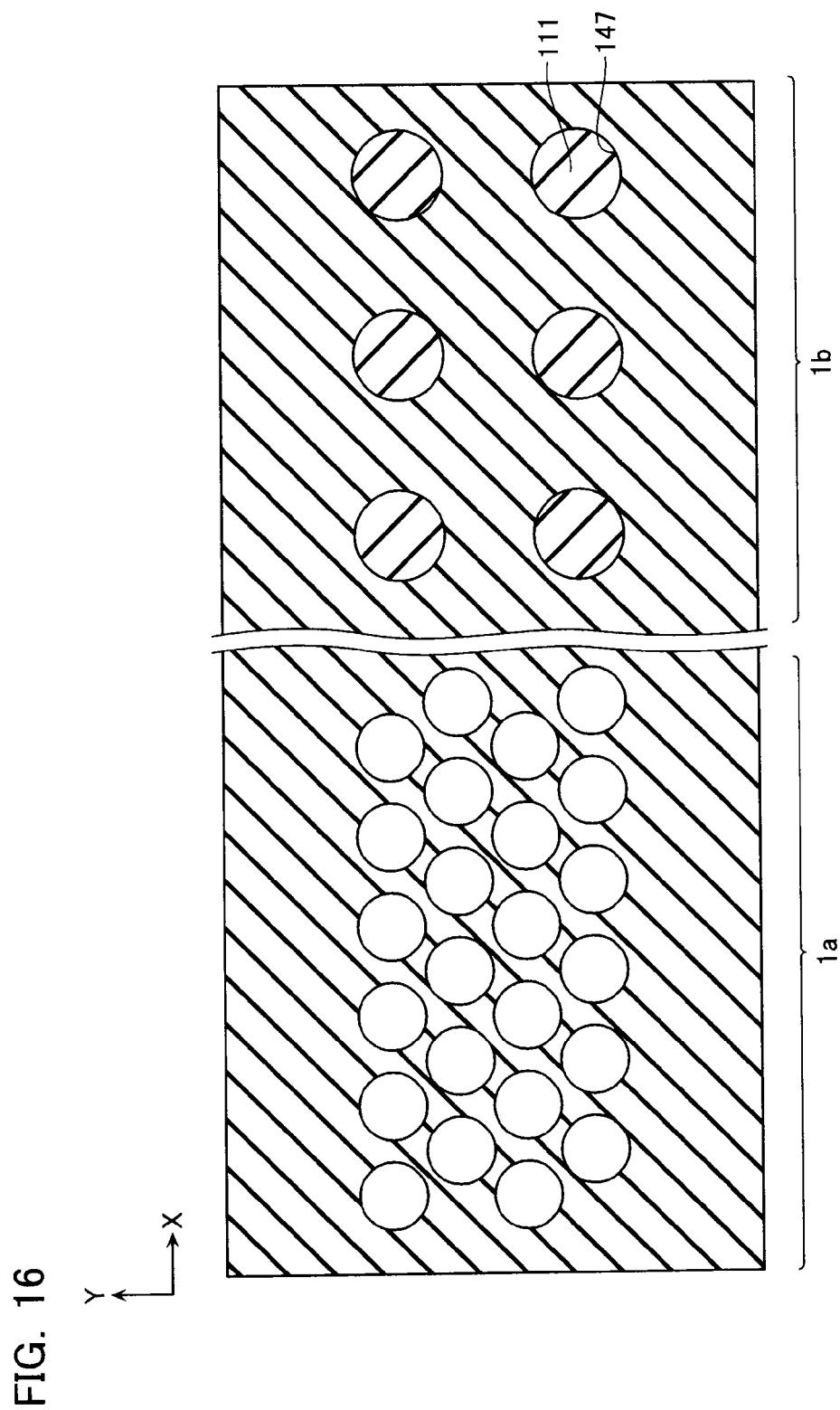

As shown in FIGS. 15 and 16, the through hole 147 is buried with a material of the beam columnar body 111. Now, the beam columnar body 111 is formed by the likes of silicon oxide (SiO$_2$), for example.

Figure 17:
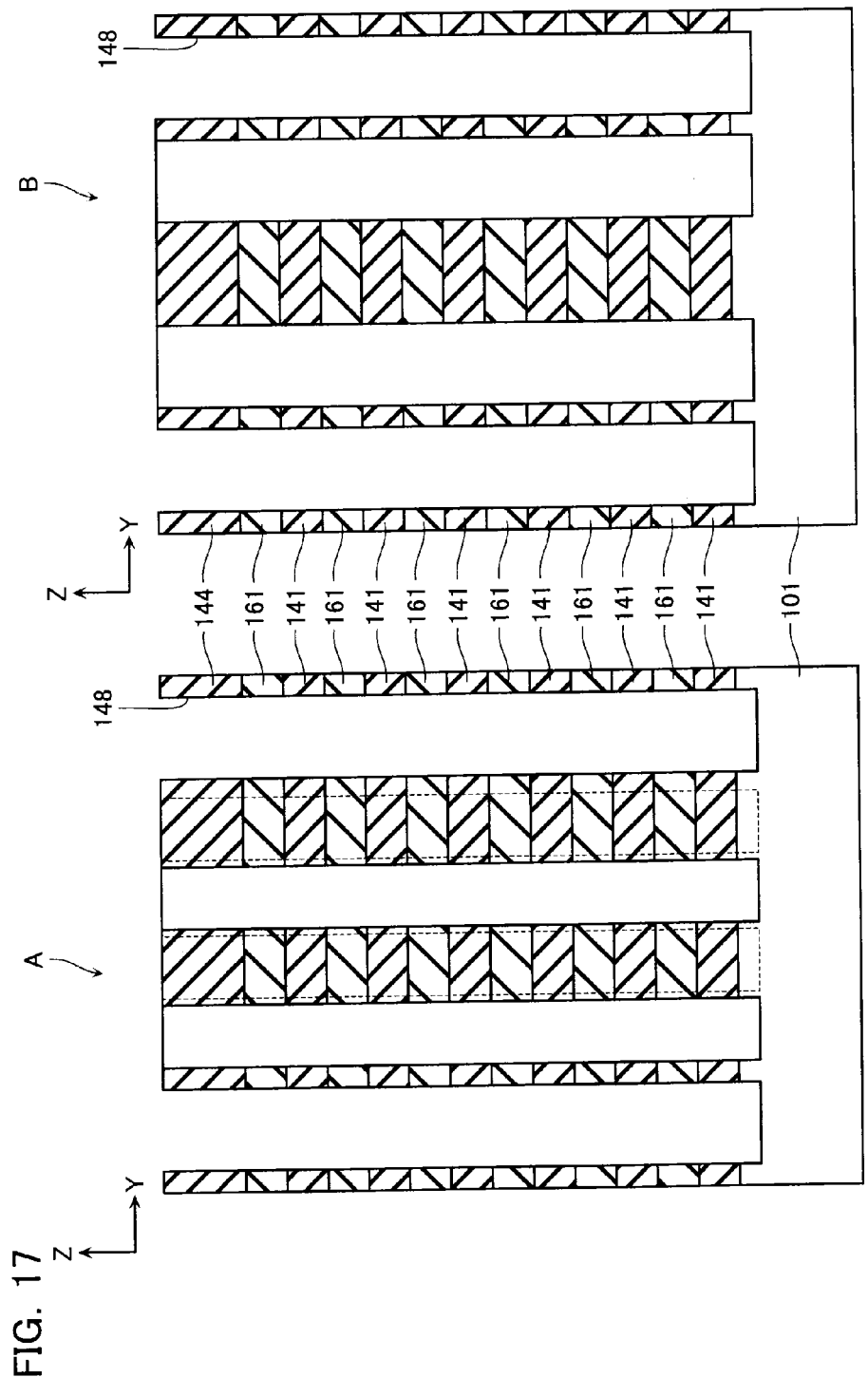
Figure 18:
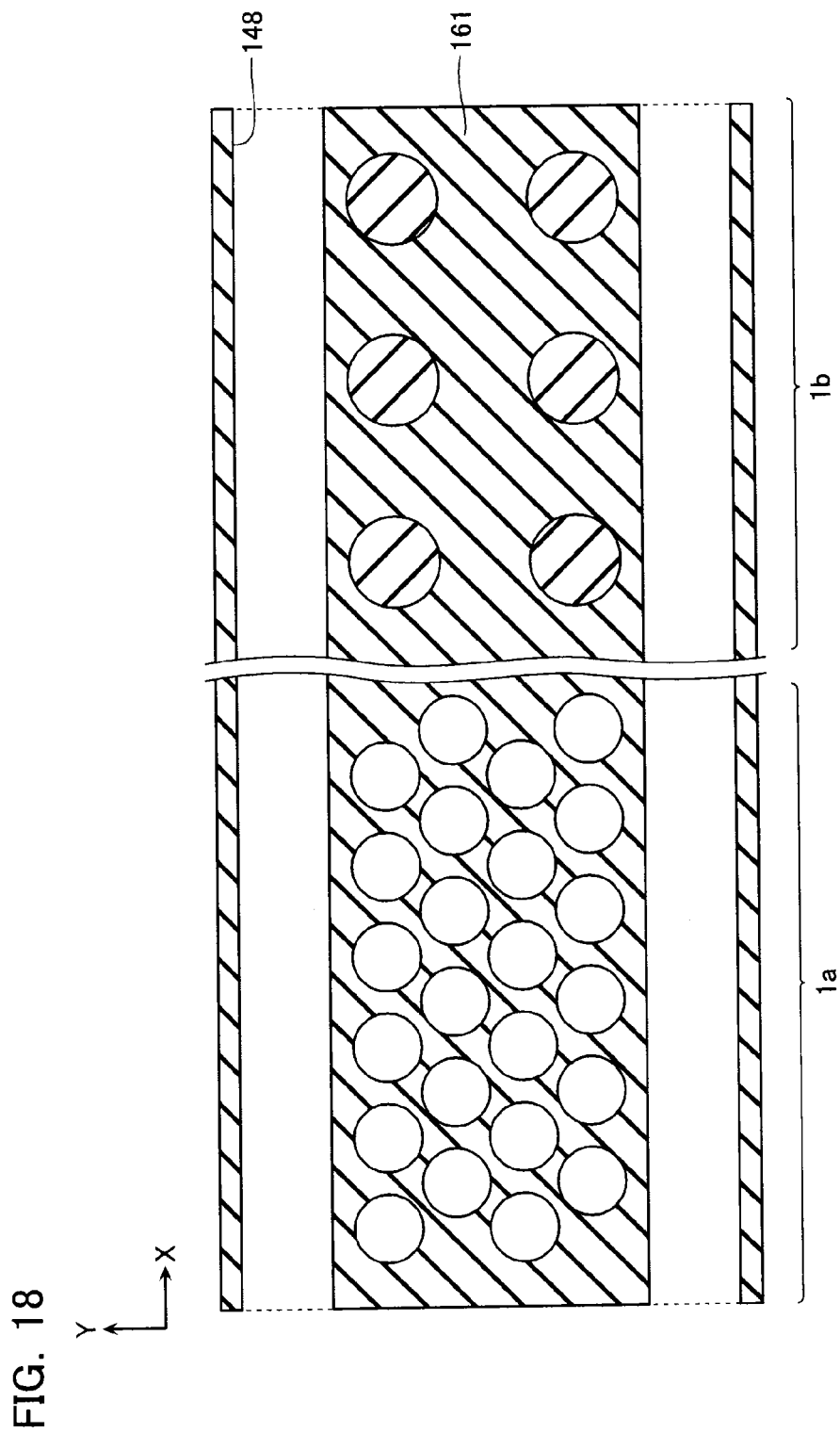

As shown in FIGS. 17 and 18, the plurality of trenches 148 having the Z direction as a depth direction and having the X direction as an extension direction are formed in the inter-layer insulating layers 141' and 144' and the sacrifice layer 161'. As a result, the inter-layer insulating layers 141' and 144' and the sacrifice layer 161' become the inter-layer insulating layers 141 and 144 and the sacrifice layer 161.

Figure 19:
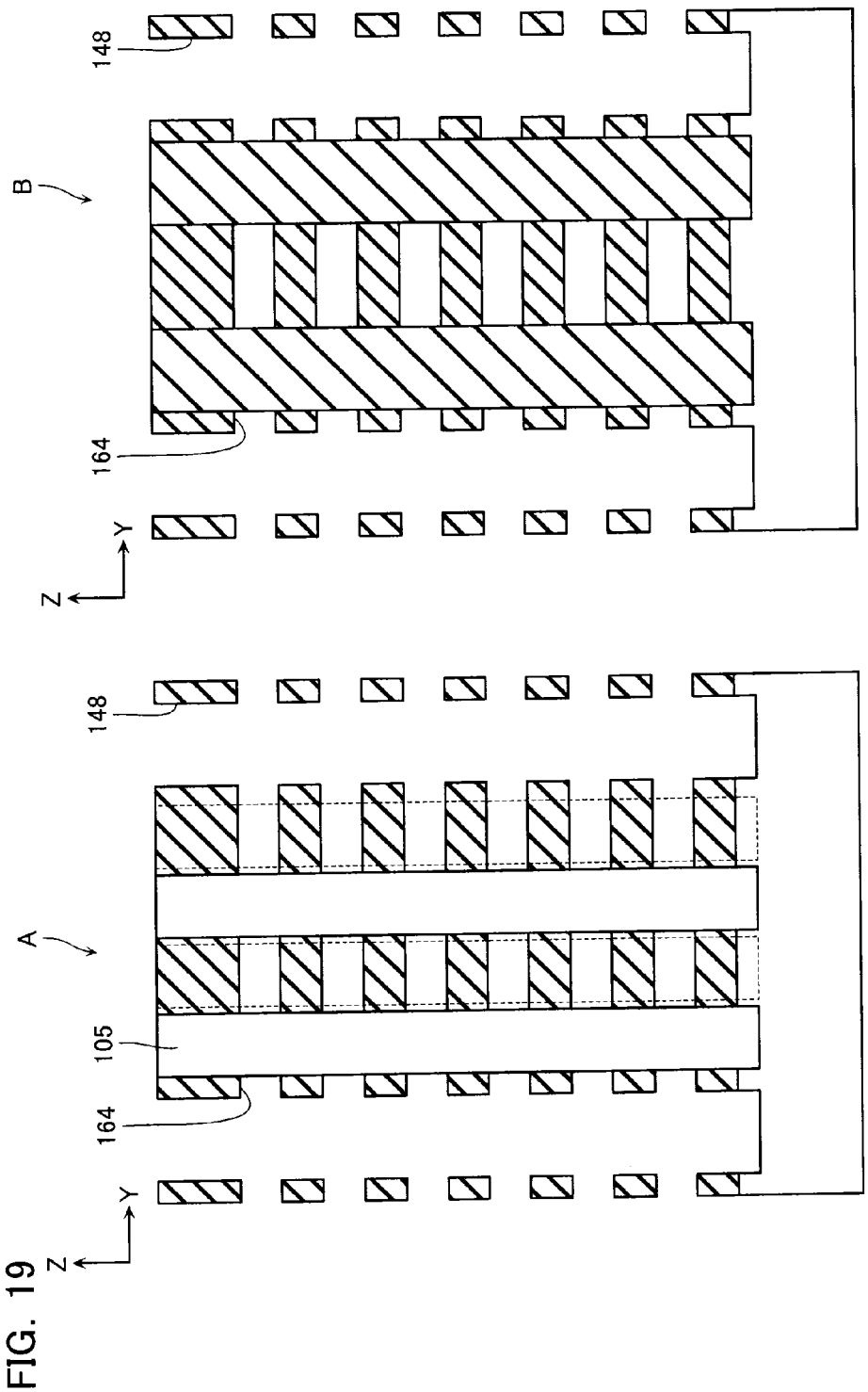
Figure 20:
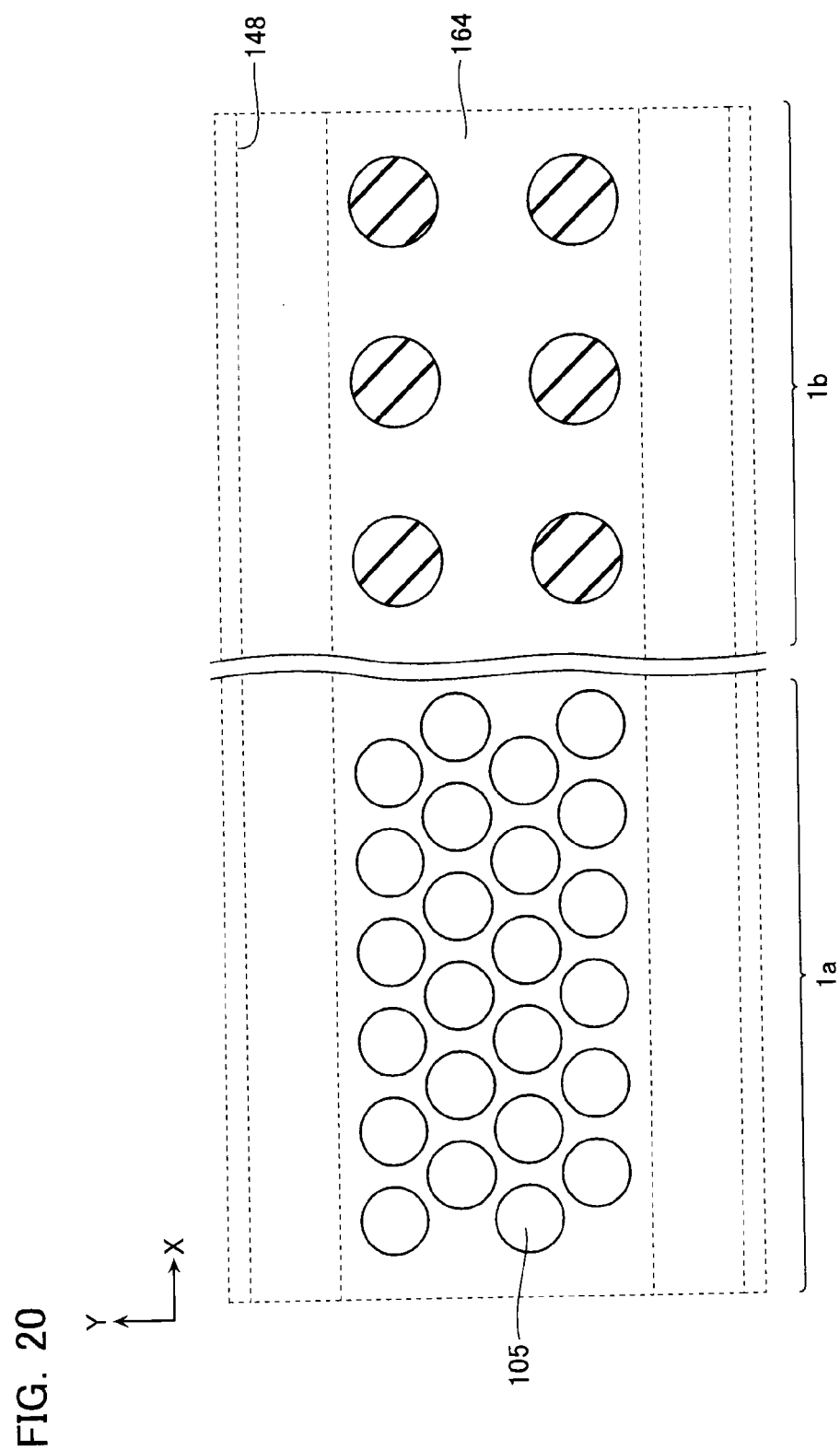

As shown in FIGS. 19 and 20, the sacrifice layer 161 is removed by etching process via the trench 148. As a result, a gap 164 is formed between the adjacent inter-layer insulating layers 141 and between the inter-layer insulating layers 141 and 144. The memory columnar body 105 is exposed in the gap 164.

Figure 21:
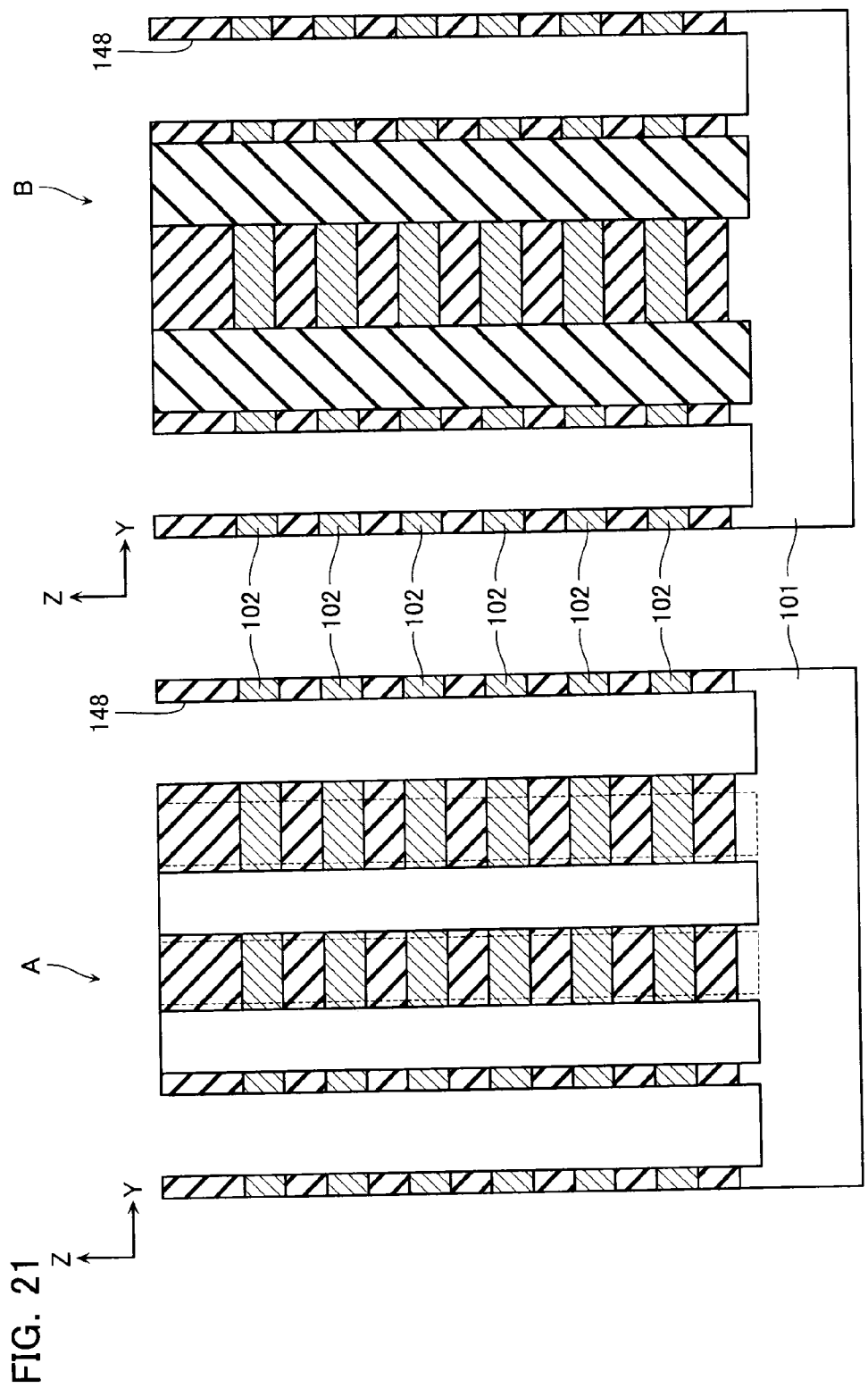
Figure 22:
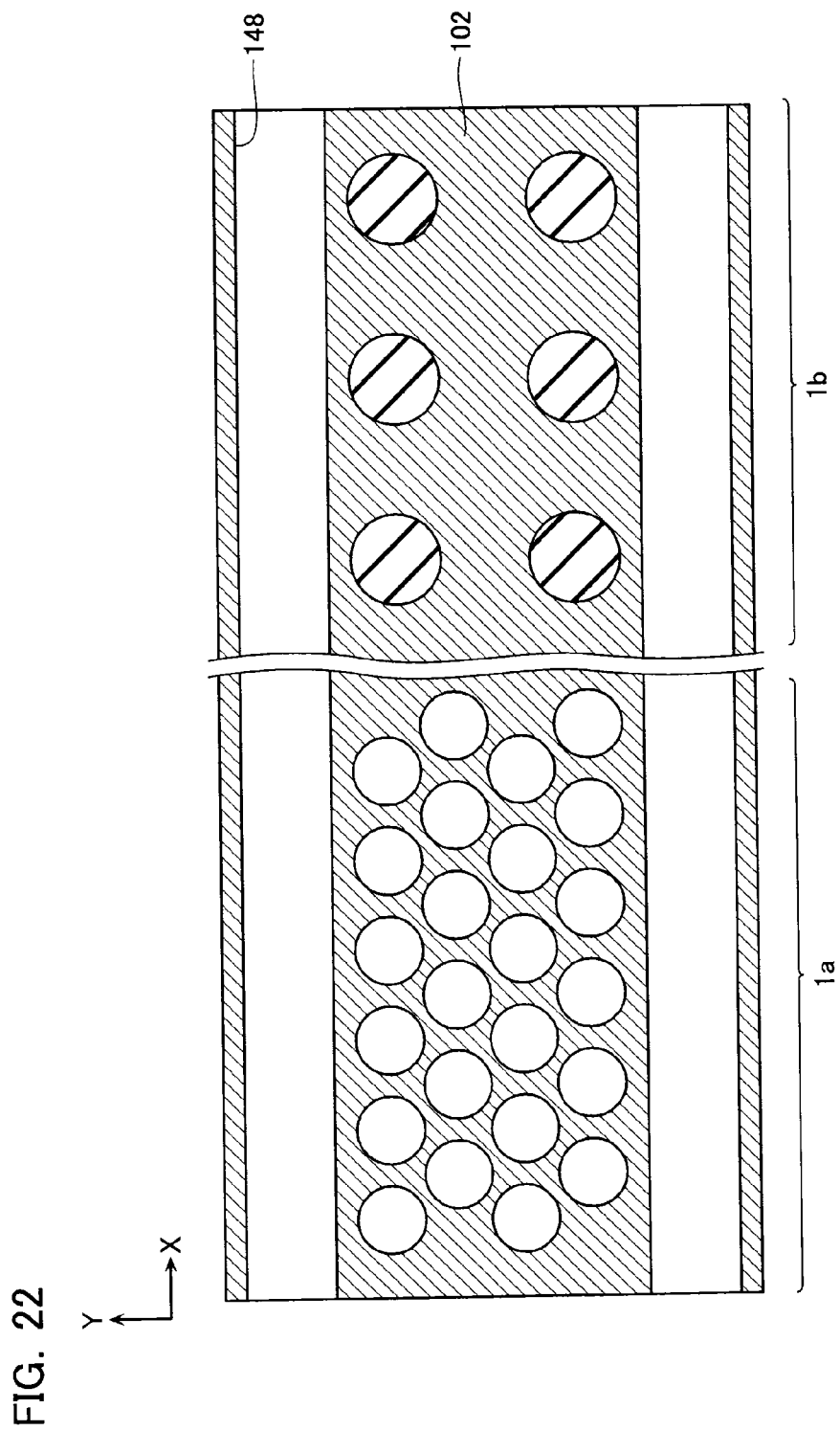

As shown in FIGS. 21 and 22, the gap 164 is buried with the conductive layer 102 via the trench 148. Now, the conductive layer 102 is formed by the likes of tungsten (W), for example. Finally, the insulating film 149 is deposited on a side surface of the trench 148 and then the conductive layer 108 is deposited, whereby the memory cell array 1 having the structure shown in FIGS. 5 and 6 is formed.

That concludes the manufacturing steps of the memory cell array 1 of the present embodiment.

Next, a structure of the memory columnar body 105 and a periphery thereof, of the present embodiment, will be described in detail.

Figure 23:
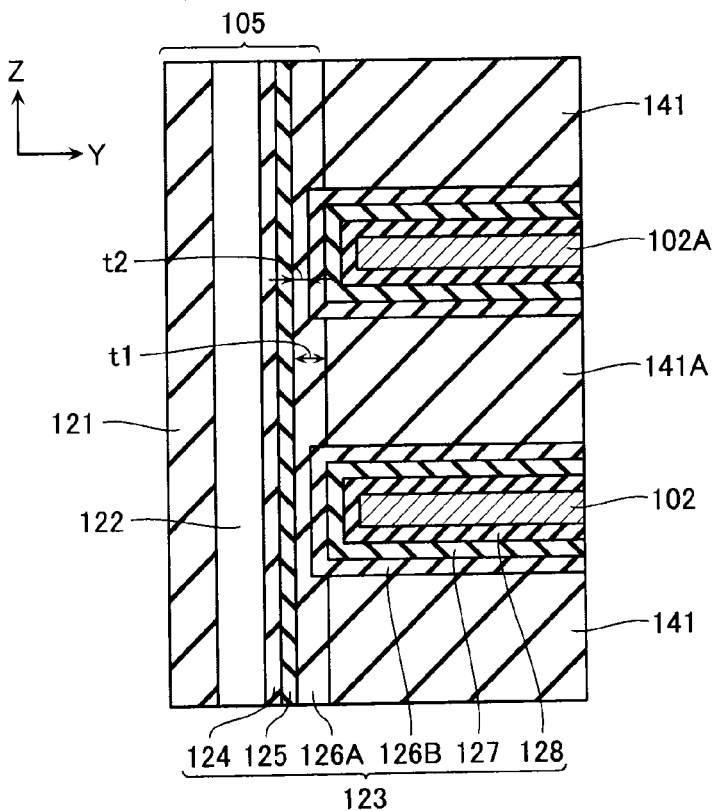
FIG. 23 is a cross-sectional view of the memory columnar body and the periphery thereof, in the semiconductor memory device according to the same embodiment.

FIG. 23 is a cross-sectional view of the memory columnar body and the periphery thereof, in the semiconductor memory device according to the present embodiment. FIG. 23 is an enlarged view of a portion surrounded by the dot-dash line in FIG. 5, and is a cross-sectional view in the Y-Z directions.

FIG. 23 shows a plurality of the conductive layers 102, a plurality of the inter-layer insulating layers 141, and the memory columnar body 105. Now, a certain inter-layer insulating layer is assumed to be 141A, and the conductive layer disposed directly above this inter-layer insulating layer 141A is assumed to be 102A. The memory columnar body 105 includes the following, disposed from the center to the outside thereof, namely: the core insulating layer 121; the semiconductor layer 122; the tunnel insulating layer 124; the charge accumulation layer 125; and the first block insulating film 126A. Moreover, the memory cell array 1 includes the following outside the memory columnar body 105, disposed from the memory columnar body 105 to the conductive layer 102 so as to cover at least a side surface and a lower surface of the conductive layer 102, namely: the second block insulating film 126B; the block high-permittivity layer 127; and the barrier layer 128. Now, the first block insulating film 126A and the second block insulating film 126B are included in the block insulating layer 126. Moreover, the tunnel insulating layer 124, the charge accumulation layer 125, and the first block insulating film 126A inside the memory columnar body 105, and the second block insulating film 126B, the block high-permittivity layer 127, and the barrier layer 128 outside the memory columnar body 105 are included in the multi-film layer 123.

Now, the first block insulating film 126A covers an outer side surface of the semiconductor layer 122 at least from a lower surface of the inter-layer insulating layer 141A to an upper surface of the conductive layer 102A in the Z direction. Moreover, the first block insulating film 126A has a structure in which a film thickness t2 at a position of the conductive layer 102A in the Z direction is less than a film thickness t1 at a position of the inter-layer insulating layer 141A in the Z direction. On the other hand, the second block insulating film 126B contacts the first block insulating film 126A and covers a side surface and a lower surface of the conductive layer 102A.

Next, a method of manufacturing the memory columnar body 105 and the periphery thereof, of the present embodiment, will be described in detail.

FIGS. 24 to 30 are cross-sectional views explaining manufacturing steps of the memory columnar body and the periphery thereof, in the semiconductor memory device according to the present embodiment. FIGS. 24 to 30 are cross-sectional views in the Y-Z directions of the portion surrounded by the dot-dash line of FIG. 5.

Up to formation of the through hole 145 shown in FIGS. 9 and 10 is performed in advance.

Figure 24:
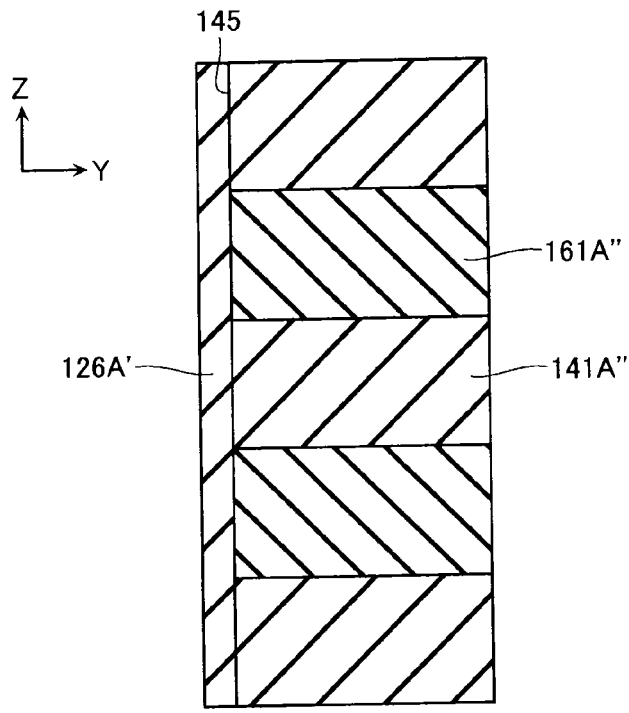
FIGS. 24 to 30 are cross-sectional views explaining manufacturing steps of the memory columnar body and the periphery thereof, in the semiconductor memory device according to the same embodiment.

As shown in FIG. 24, a first block insulating film 126A' is deposited on a side surface of the through hole 145. The first block insulating film 126A' is deposited at least from a lower surface of an inter-layer insulating layer 141A' to an upper surface of a sacrifice layer 161A'' in the Z direction. The first block insulating film 126A' is formed by the likes of silicon oxide ($SiO_2$), for example. Note that deposition of the first block insulating film 126A' may employ the likes of silicon oxide ($SiO_2$), for example, by the likes of low pressure chemical vapor deposition (LPCVD) and atomic layer deposition (ALD), for example. Moreover, the first block insulating film 126A' can also be formed by oxidizing a part of the sacrifice layer 161 by radical oxidation of an in situ steam generation (ISSG) process, and so on.

Figure 25:
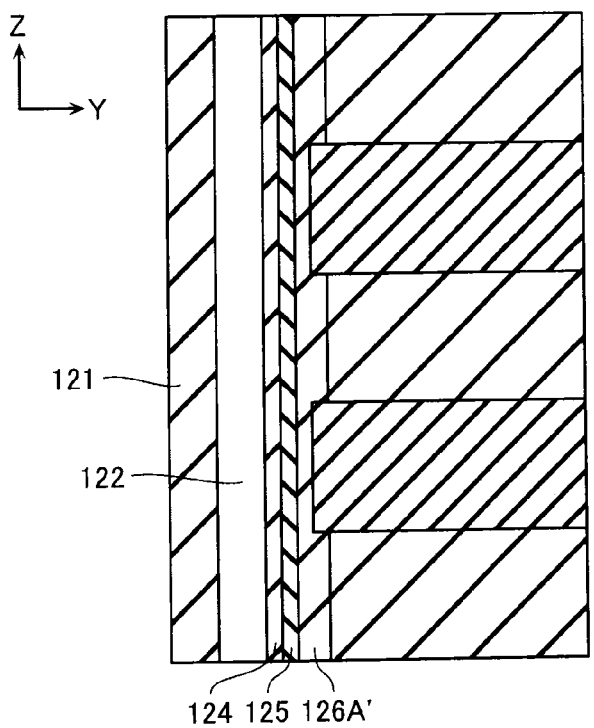

As shown in FIG. 25, the charge accumulation layer 125, the tunnel insulating layer 124, the semiconductor layer 122, and the core insulating layer 121 are deposited sequentially on an inner side surface of the first block insulating film 126A. The charge accumulation layer 125 is formed by a material capable of charge accumulation, such as silicon nitride (SiN), for example. The tunnel insulating layer 124 is formed by the likes of silicon oxide ($SiO_2$), for example. The semiconductor layer 122 is formed by the likes of polysilicon (Poly-Si), for example. The core insulating layer 121 is formed by the likes of silicon oxide ($SiO_2$), for example.

Figure 26:
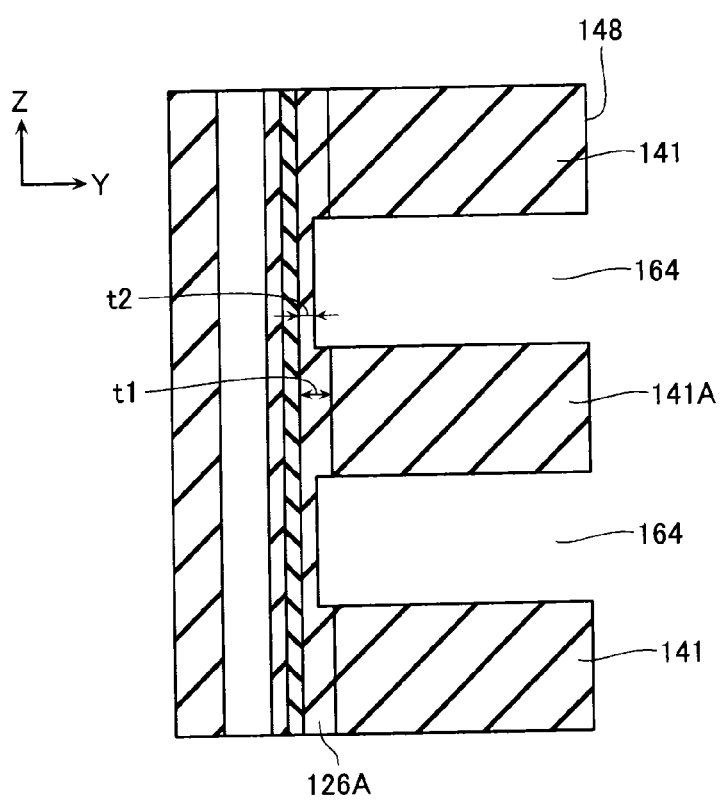

As shown in FIG. 26, the sacrifice layer 161 is removed by etching process via the trench 148. Employed in removal of the sacrifice layer 161 is, for example, wet etching by a phosphoric acid solution ($H_3PO_4$). As a result, a gap 164 is formed between the inter-layer insulating layers 141. At this time, a part of the first block insulating film 126A is exposed in the gap 164, hence this exposed portion ends up being etched. As a result, the first block insulating film 126A' becomes the first block insulating film 126 having a structure in which the film thickness t2 at a position of the gap 164 in the Z direction is less than the film thickness t1 at a position of the inter-layer insulating layer 141A in the Z direction.

Figure 27:
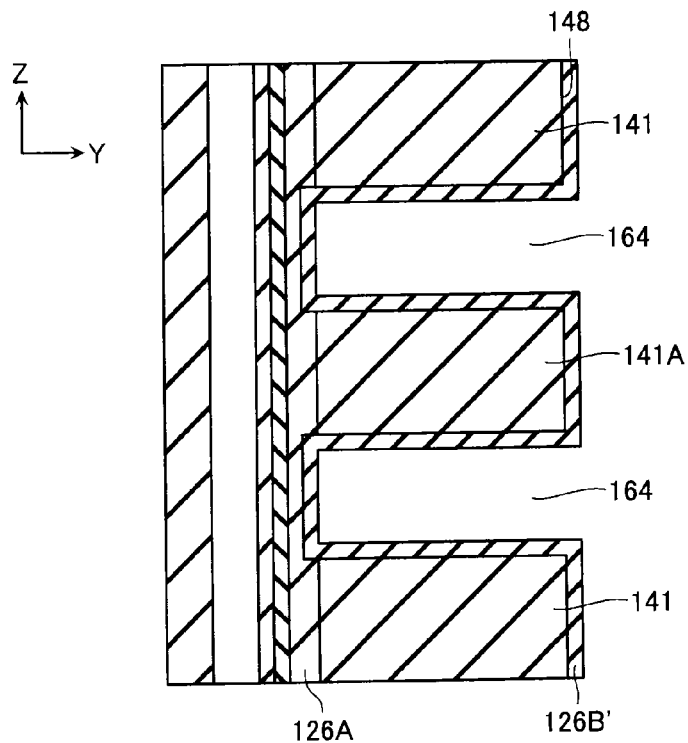

As shown in FIG. 27, a second block insulating film 126B' is deposited, via the trench 148, on a side surface of the inter-layer insulating layer 141 exposed in the trench 148, and a lower surface of the inter-layer insulating layer 141 and an outer side surface of the first block insulating film 126A exposed in the gap 164. The second block insulating film 126B' is formed by the likes of silicon oxide ($SiO_2$), for example. Note that if a part of the charge accumulation layer 125 is oxidized, that portion may also substitute the second block insulating film 126B'.

Figure 28:
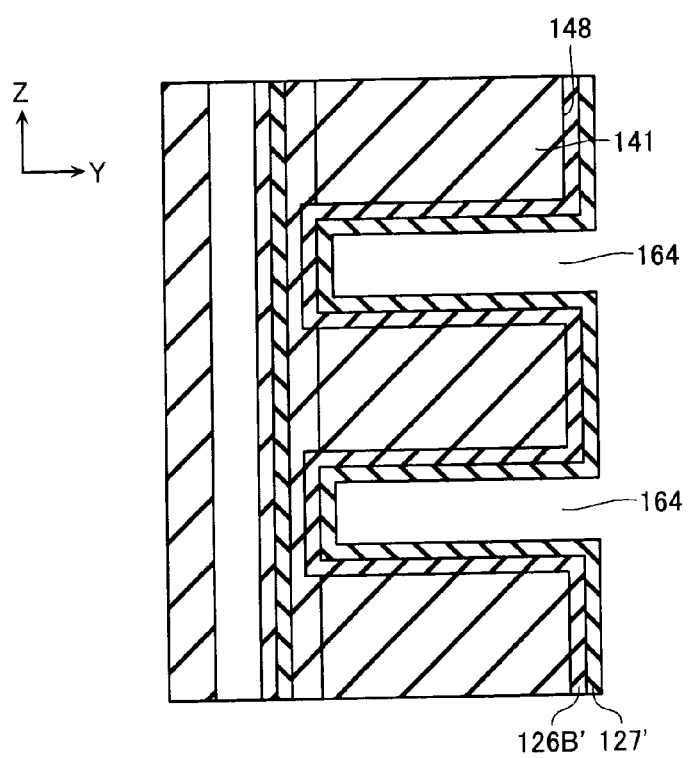

As shown in FIG. 28, a block high-permittivity layer 127' is deposited, via the trench 148, on an outer surface of the second block insulating film 126B' exposed in the trench 148 and the gap 164. The block high-permittivity layer 127' is formed by the likes of alumina ($Al_2O_3$) or hafnium oxide ($HfO_x$), for example.

Figure 29:
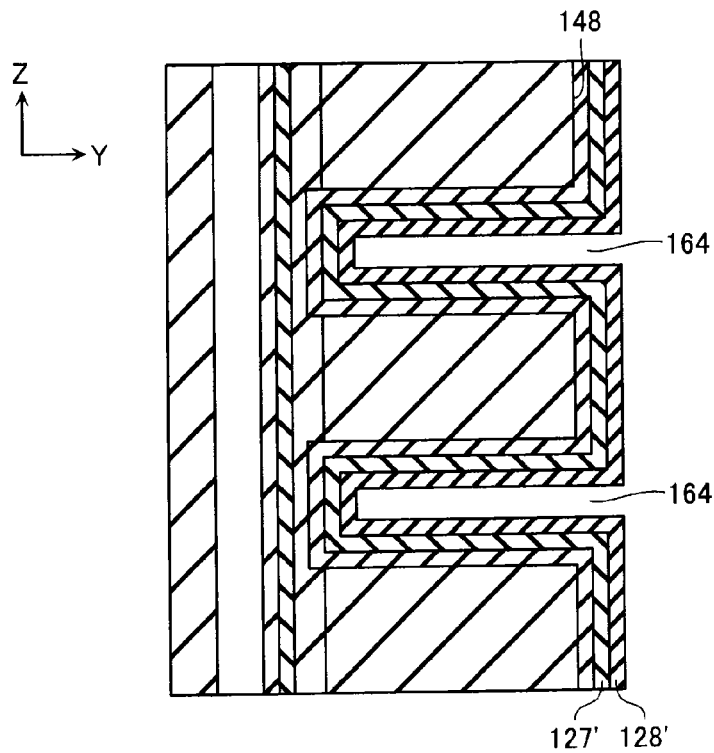

As shown in FIG. 29, a barrier layer 128' is deposited, via the trench 148, on an outer surface of the block high-permittivity layer 127' exposed in the trench 148 and the gap 164. The barrier layer 128' is formed by the likes of titanium nitride (TiN), tungsten nitride (WN), and tantalum nitride (TaN), for example.

Figure 30:
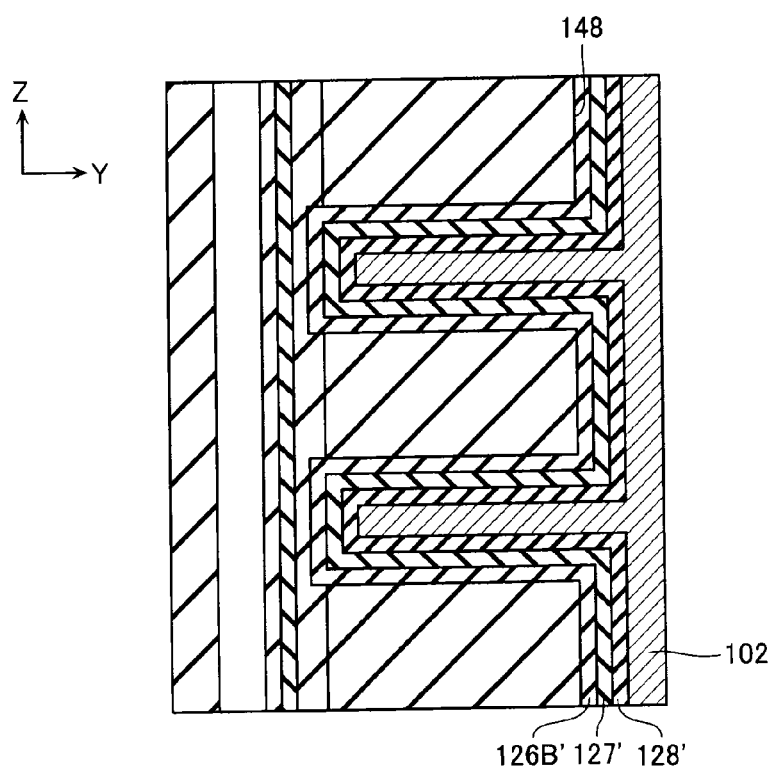

As shown in FIG. 30, the inside of the gap 164 where the barrier layer 128' is deposited is filled by a conductive layer 102', via the trench 148. Finally, parts of the second block insulating film 126B', the block high-permittivity layer 127', the barrier layer 128', and the conductive layer 102' inside the trench 148 are removed. As a result, the second block insulating film 126B', the block high-permittivity layer 127', the barrier layer 128', and the conductive layer 102' become the second block insulating film 126B, the block high-permittivity layer 127, the barrier layer 128, and the conductive layer 102.

The above steps make it possible to form the memory columnar body 105 and the periphery thereof having the structure shown in FIG. 23.

Next, advantages of the present embodiment will be described using a memory cell array according to a first comparative example.

Figure 31:
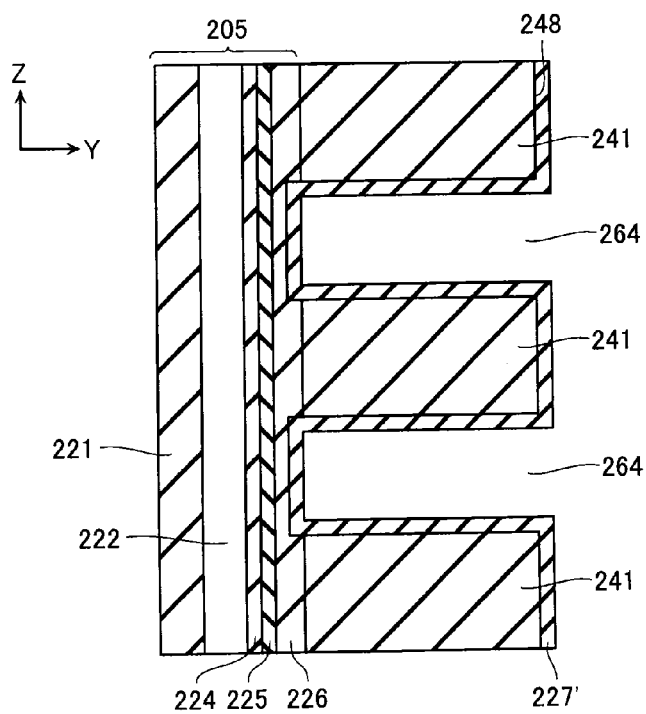
FIGS. 31 and 32 are cross-sectional views explaining manufacturing steps of a memory columnar body and a periphery thereof, in a semiconductor memory device according to a first comparative example to the same embodiment.
Figure 32:
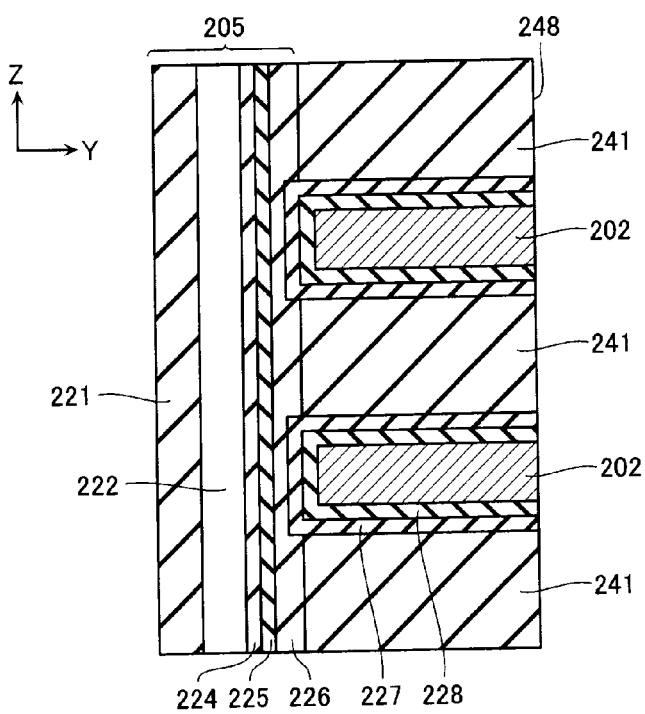

FIGS. 31 and 32 are cross-sectional views explaining manufacturing steps of a memory columnar body and a periphery thereof, in a semiconductor memory device according to the first comparative example to the present embodiment. FIGS. 31 and 32 are cross-sectional views in the Y-Z directions of a portion corresponding to the portion surrounded by the dot-dash line of FIG. 5.

In contrast to the memory cell array 1 of the present embodiment, the memory cell array according to the present comparative example has a structure in which there is no second block insulating film 126B. In other words, a memory columnar body 205 (corresponding to 105) of the present comparative example includes the following, disposed from the center to the outside thereof, namely: a core insulating layer 221 (corresponding to 121); a semiconductor layer 222 (corresponding to 122); a tunnel insulating layer 224 (corresponding to 124); a charge accumulation layer 225 (corresponding to 125); and a block insulating layer 226 (corresponding to 126A). Furthermore, the memory cell array of the present comparative example includes the following outside the memory columnar body 205, disposed from the memory columnar body 205 to a conductive layer 202 (corresponding to 102) so as to cover a side surface and a lower surface of the conductive layer 202, namely: a block high-permittivity layer 227 (corresponding to 127); and a barrier layer 228 (corresponding to 128). Now, the block insulating layer 226, similarly to the first block insulating film 126A, has a structure in which a film thickness at a position of the conductive layer 202 (corresponding to 102) in the Z direction is less than a film thickness at a position of an inter-layer insulating layer 241 (corresponding to 141) in the Z direction.

The memory cell array of the present comparative example can be formed by the following manufacturing steps. As shown in FIG. 31, after steps similar to those of FIGS. 24 to 26, a block high-permittivity layer 227' is deposited, via a trench 248 (corresponding to 148), on a side surface of the inter-layer insulating layer 241 exposed in the trench 248, and a lower surface of the inter-layer insulating layer 241 and an outer side surface of the block insulating layer 226 exposed in a gap 264 (corresponding to 164). Subsequently, as a result of steps similar to those of FIGS. 29 and 30, a structure of the memory columnar body 205 and the periphery thereof shown in FIG. 32, is formed.

In the case of the present comparative example, similarly to in the first embodiment, a portion exposed between the inter-layer insulating layers 241, of the block insulating layer 226, ends up being etched and thinned, during removal of a sacrifice layer 261 (corresponding to 161). Moreover, a variation in electrical characteristics of the memory cells MC ends up occurring due to a variation in etching amount of this block insulating layer 226.

In this regard, the present embodiment makes it possible for a variation in film thickness of the first block insulating film 126A occurring during removal of the sacrifice layer 161 to be compensated during deposition of the second block insulating film 126B. This makes it possible to provide a semiconductor memory device in which there is less variation of electrical characteristics of the memory cells MC than in the first comparative example.

Second Embodiment

The first embodiment described a semiconductor memory device having a structure in which the memory columnar body included from the core insulating layer to the block insulating layer. In contrast, a second embodiment describes a semiconductor memory device having a structure in which the memory columnar body includes from the core insulating layer to the block high-permittivity layer. Note that here, points of difference from the first embodiment will mainly be described.

Figure 33:
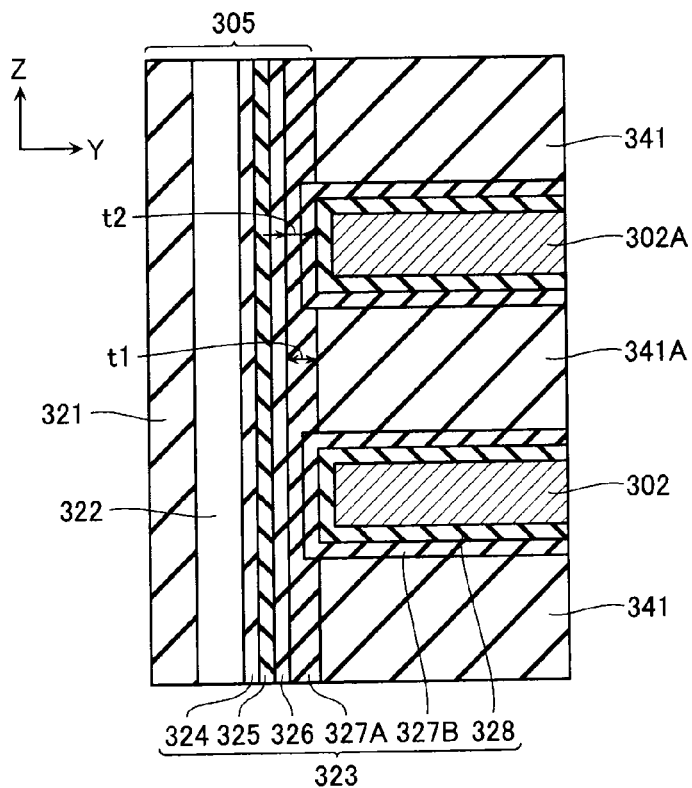
FIG. 33 is a cross-sectional view of a memory columnar body and a periphery thereof, in a semiconductor memory device according to a second embodiment.

FIG. 33 is a cross-sectional view of a memory columnar body and a periphery thereof, in a semiconductor memory device according to the second embodiment. FIG. 33 is a cross-sectional view in the Y-Z directions enlarging a portion corresponding to the portion surrounded by the dot-dash line in FIG. 5.

FIG. 33 shows a plurality of conductive layers 302 (corresponding to 102), a plurality of inter-layer insulating layers 341 (corresponding to 141), and a memory columnar body 305 (corresponding to 105). Now, a certain inter-layer insulating layer is assumed to be 341A, and the conductive layer disposed directly above this inter-layer insulating layer 341A is assumed to be 302A. The memory columnar body 305 includes the following, disposed from the center to the outside thereof, namely: a core insulating layer 321 (corresponding to 121); a semiconductor layer 322 (corresponding to 122); a tunnel insulating layer 324 (corresponding to 124); a charge accumulation layer 325 (corresponding to 125); a block insulating layer 326 (corresponding to 126A); and a first block high-permittivity film 327A. Moreover, the memory cell array 1 includes the following outside the memory columnar body 305, disposed from the memory columnar body 305 to the conductive layer 302 so as to cover at least a side surface and a lower surface of the conductive layer 302, namely: a second block high-permittivity film 327B; and a barrier layer 328 (corresponding to 128). Now, the first block high-permittivity film 327A and the second block high-permittivity film 327B are included in a block high-permittivity layer 327. The first block high-permittivity film 327A and the second block high-permittivity film 327B include an aluminum oxide film formed by the likes of alumina ($Al_2O_3$), for example. Moreover, the first block high-permittivity film 327A and the second block high-permittivity film 327B may be formed by the likes of hafnium oxide ($HfO_x$). The tunnel insulating layer 324, the charge accumulation layer 325, the block insulating layer 326, and the first block high-permittivity film 327A inside the memory columnar body 305, and the second block high-permittivity film 327B and the barrier layer 328 outside the memory columnar body 305 are included in a multi-film layer 323 (corresponding to 123).

Now, the first block high-permittivity film 327A covers a side surface of the semiconductor layer 322 at least from a lower surface of the inter-layer insulating layer 341A to an upper surface of the conductive layer 302A in the Z direction. Moreover, the first block high-permittivity film 327A has a structure in which a film thickness t2 at a position of the conductive layer 302A in the Z direction is less than a film thickness t1 at a position of the inter-layer insulating layer 341A in the Z direction. On the other hand, the second block high-permittivity film 327B contacts the first block high-permittivity film 327A and covers a side surface and a lower surface of the conductive layer 302A.

Next, a method of manufacturing the memory columnar body 305 and the periphery thereof, of the present embodiment, will be described in detail.

FIGS. 34 to 39 are cross-sectional views explaining manufacturing steps of the memory columnar body and the periphery thereof, in the semiconductor memory device according to the present embodiment. FIGS. 34 to 39 are cross-sectional views in the Y-Z directions of a portion shown in FIG. 33.

Up to formation of a through hole 345 (corresponding to 145) is performed in advance, similarly to in steps shown in FIGS. 9 and 10.

Figure 34:
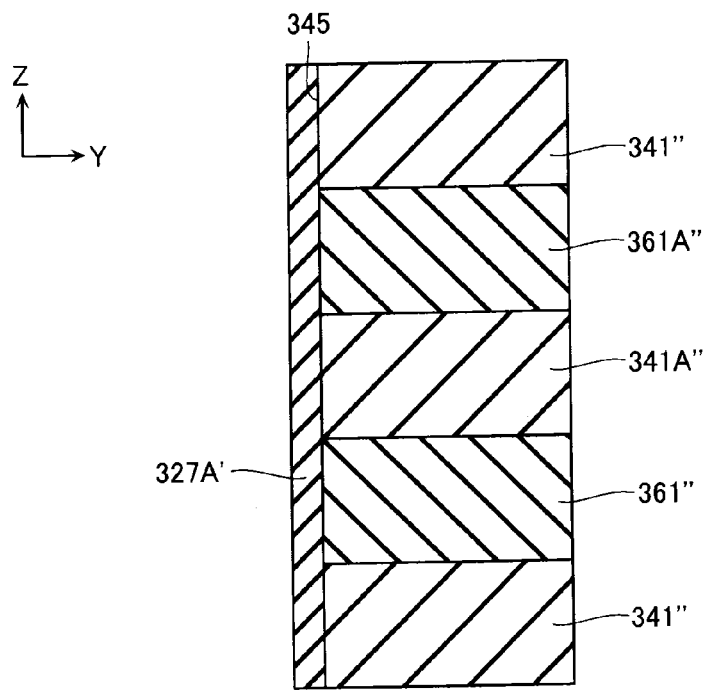
FIGS. 34 to 39 are cross-sectional views explaining manufacturing steps of the memory columnar body and the periphery thereof, in the semiconductor memory device according to the same embodiment.

As shown in FIG. 34, a first block high-permittivity film 327A' is deposited on a side surface of the through hole 345. The first block high-permittivity film 327A' is deposited at least from a lower surface of an inter-layer insulating layer 341A" to an upper surface of a sacrifice layer 361A" (corresponding to 161A") in the Z direction. The first block high-permittivity film 327A' is formed by the likes of alumina ($Al_2O_3$) or hafnium oxide ($HfO_x$), for example.

Figure 35:
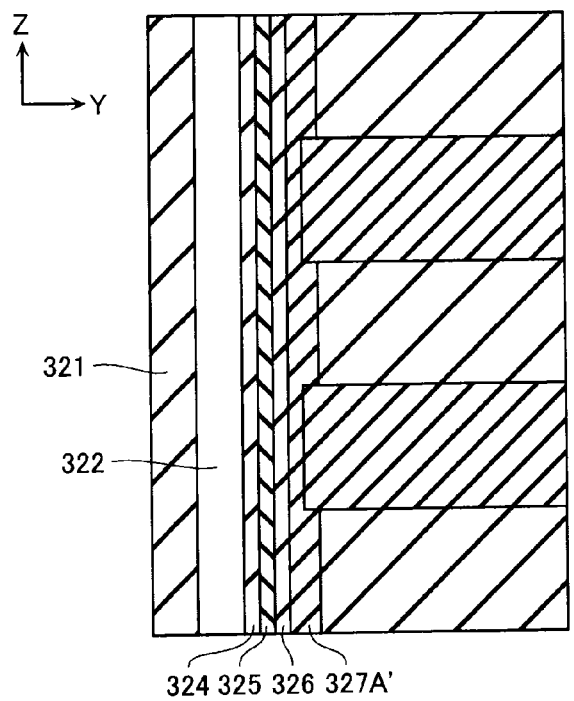

As shown in FIG. 35, the block insulating layer 326, the charge accumulation layer 325, the tunnel insulating layer 324, the semiconductor layer 322, and the core insulating layer 321 are deposited sequentially on an inner side surface of the first block high-permittivity film 327A'.

Figure 36:
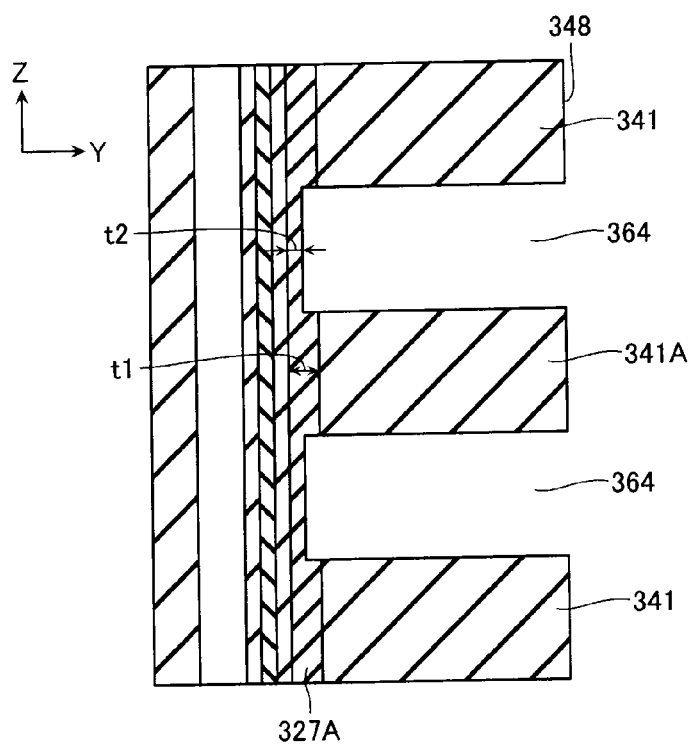

As shown in FIG. 36, the sacrifice layer 361 is removed by etching process via a trench 348 (corresponding to 148). As a result, a gap 364 (corresponding to 164) is formed between the inter-layer insulating layers 341. At this time, apart of the first block high-permittivity film 327A is exposed between the inter-layer insulating layers 341, hence this exposed portion ends up being etched. As a result, the first block high-permittivity film 327A' becomes the first block high-permittivity film 327A having a structure in which the film thickness t2 at a position of the gap 364 in the Z direction is less than the film thickness t1 at a position of the inter-layer insulating layer 341A in the Z direction.

Figure 37:
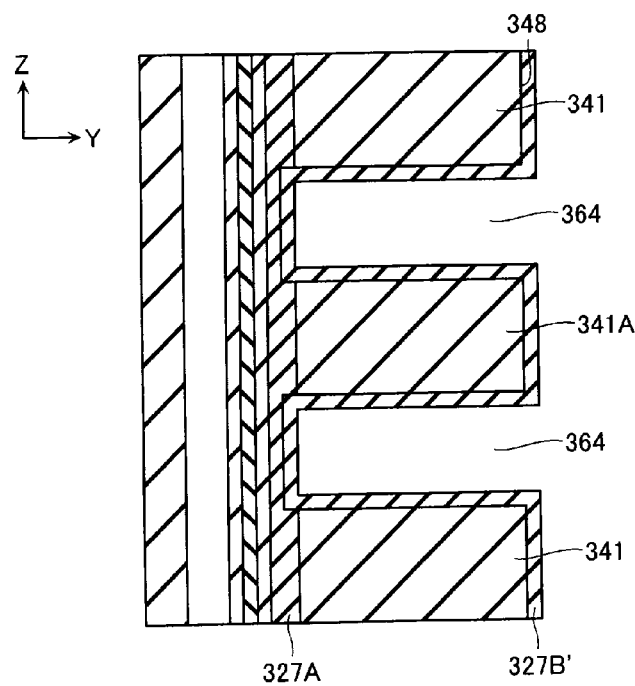

As shown in FIG. 37, a second block high-permittivity film 327B' is deposited, via the trench 348, on a side surface of the inter-layer insulating layer 341 exposed in the trench 348, and a lower surface of the inter-layer insulating layer 341 and an outer side surface of the first block high-permittivity film 327A exposed in the gap 364. The second block high-permittivity film 327B' is formed by the likes of alumina ($Al_2O_3$) or hafnium oxide ($HfO_x$), for example.

Figure 38:
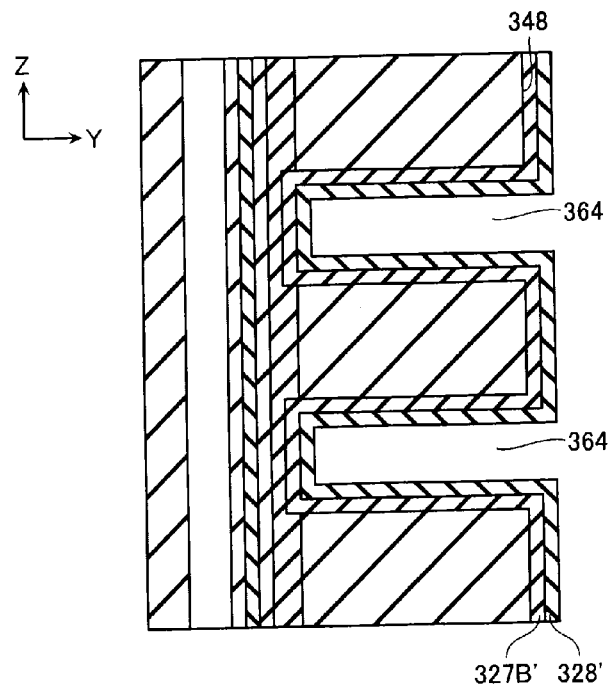

As shown in FIG. 38, a barrier layer 328' is deposited, via the trench 348, on an outer surface of the second block high-permittivity film 327B' exposed in the trench 348 and the gap 364.

Figure 39:
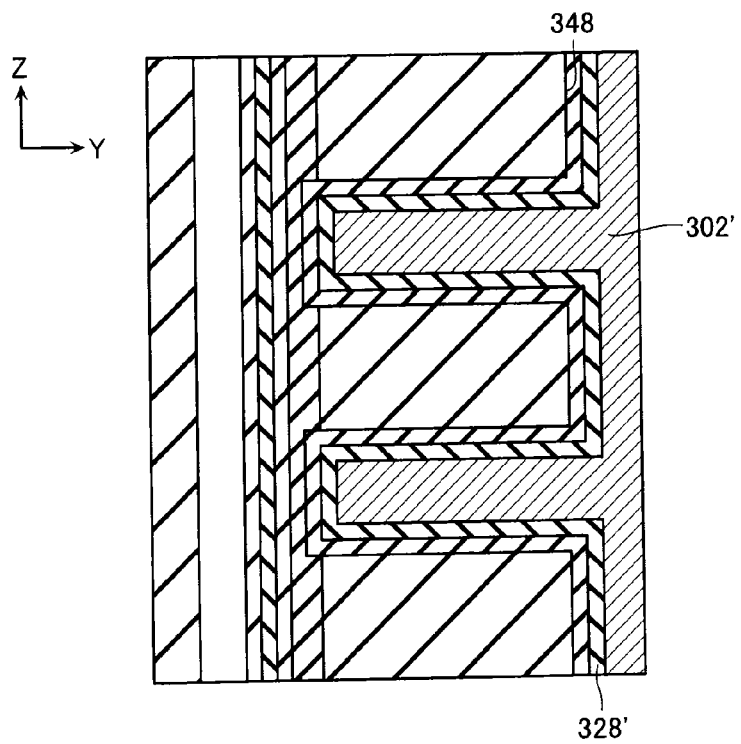

As shown in FIG. 39, the inside of the gap 364 where the barrier layer 328' is deposited is filled by a conductive layer 302', via the trench 348. Finally, parts of the second block high-permittivity film 327B', the barrier layer 328', and the conductive layer 302' inside the trench 348 are removed. As a result, the second block high-permittivity film 327B', the barrier layer 328', and the conductive layer 302' become the second block high-permittivity film 327B, the barrier layer 328, and the conductive layer 302.

The above steps make it possible to form the memory columnar body 305 and the periphery thereof having the structure shown in FIG. 33.

Next, advantages of the present embodiment will be described using a memory cell array according to a second comparative example.

Figure 40:
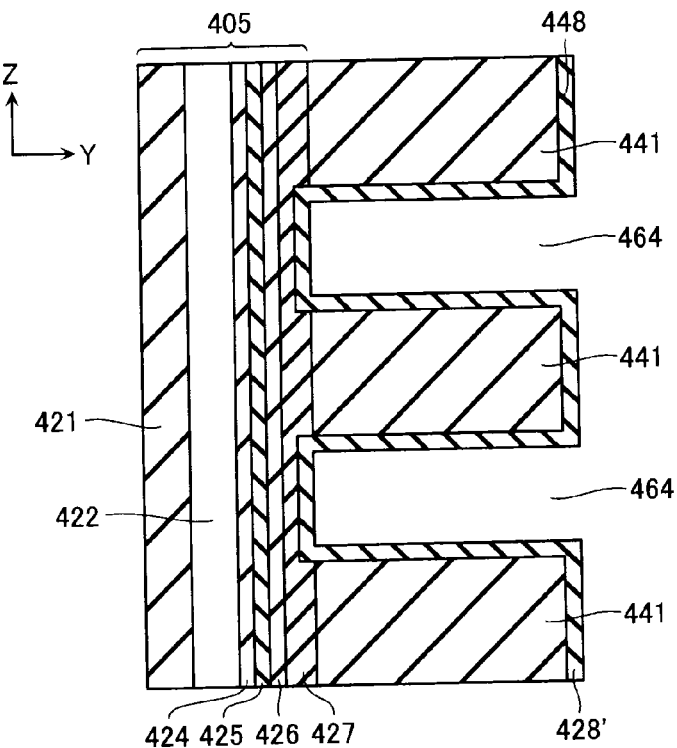
FIGS. 40 and 41 are cross-sectional views explaining manufacturing steps of a memory columnar body and a periphery thereof, in a semiconductor memory device according to a second comparative example to the same embodiment.
Figure 41:
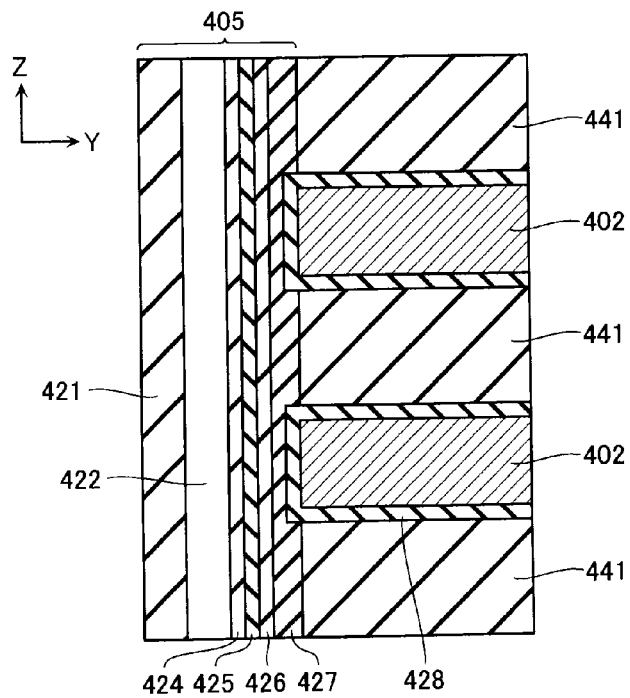

FIGS. 40 and 41 are cross-sectional views explaining manufacturing steps of a memory columnar body and a periphery thereof, in a semiconductor memory device according to the second comparative example to the present embodiment. FIGS. 40 and 41 are cross-sectional views in the Y-Z directions of a portion corresponding to the portion surrounded by the dot-dash line of FIG. 5.

In contrast to the memory cell array 1 of the present embodiment, the memory cell array according to the present comparative example has a structure in which there is no second block high-permittivity film 327B. In other words, a memory columnar body 405 (corresponding to 305) of the present comparative example includes the following, disposed from the center to the outside thereof, namely: a core insulating layer 421 (corresponding to 321); a semiconductor layer 422 (corresponding to 322); a tunnel insulating layer 424 (corresponding to 324); a charge accumulation layer 425 (corresponding to 325); a block insulating layer 426 (corresponding to 326); and a block high-permittivity layer 427 (corresponding to 327A). Furthermore, the memory cell array of the present comparative example includes the following outside the memory columnar body 405, disposed between the memory columnar body 405 and a conductive layer 402 (corresponding to 302) so as to cover a side surface and a lower surface of the conductive layer 402, namely: a barrier layer 428 (corresponding to 328). Now, the block high-permittivity layer 427, similarly to the first block high-permittivity film 427A, has a structure in which a film thickness at a position of the conductive layer 402 (corresponding to 302) in the Z direction is less than a film thickness at a position of an inter-layer insulating layer 441 (corresponding to 341) in the Z direction.

The memory cell array of the present comparative example can be formed by the following manufacturing steps. In other words, as shown in FIG. 40, after steps similar to those of FIGS. 34 to 36, a barrier layer 428' is deposited, via a trench 448 (corresponding to 348), on a side surface of the inter-layer insulating layer 441 exposed in the trench 448, and a lower surface of the inter-layer insulating layer 441 and an outer side surface of the block high-permittivity layer 427 exposed in a gap 464 (corresponding to 364). Subsequently, steps similar to those of FIGS. 38 and 39 make it possible to form a structure of the memory columnar body 405 and the periphery thereof shown in FIG. 41.

In the case of the present comparative example, similarly to in the second embodiment, a portion exposed between the inter-layer insulating layers 441, of the block high-permittivity layer 427, ends up being etched and thinned, during removal of a sacrifice layer 461 (corresponding to 361). Moreover, a variation in electrical characteristics of the memory cells MC ends up occurring due to a variation in etching amount of this block high-permittivity layer 427.

In this regard, the present embodiment makes it possible for a variation in film thickness of the first block high-permittivity film 327A occurring during removal of the sacrifice layer 361 to be compensated during deposition of the second block high-permittivity film 327B. This makes it possible to provide a semiconductor memory device in which there is less variation of electrical characteristics of the memory cells MC than in the second comparative example.

Third Embodiment

The second embodiment described a semiconductor memory device in which a variation in the block high-permittivity layer is compensated by configuring the block high-permittivity layer as a multi-film structure. In contrast, a third embodiment describes a semiconductor memory device in which a cover insulating layer that protects the block high-permittivity layer is deposited on an outer side surface of the block high-permittivity layer. Note that here, points of difference from the second embodiment will mainly be described.

Figure 42:
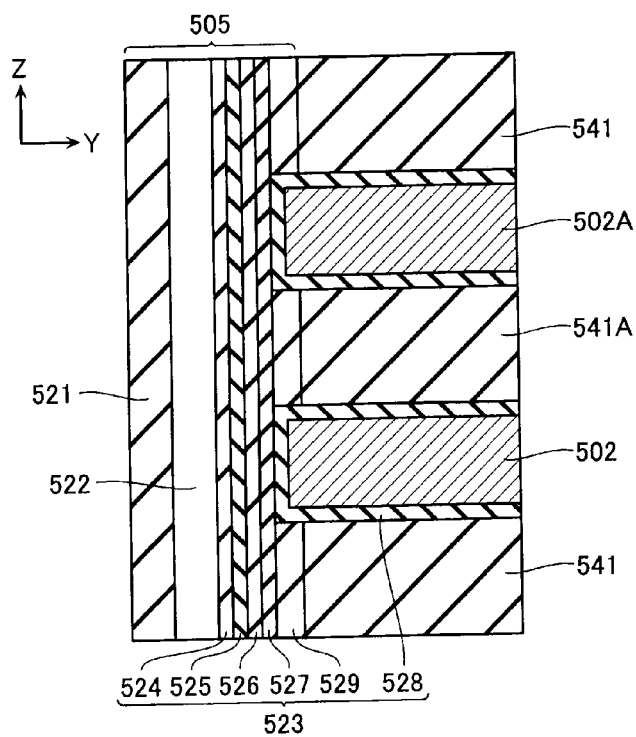
FIG. 42 is a cross-sectional view of a memory columnar body and a periphery thereof, in a semiconductor memory device according to a third embodiment.

FIG. 42 is a cross-sectional view of a memory columnar body and a periphery thereof, in a semiconductor memory device according to the third embodiment. FIG. 42 is a cross-sectional view in the Y-Z directions enlarging a portion corresponding to the portion surrounded by the dot-dash line in FIG. 5.

FIG. 42 shows a plurality of conductive layers 502 (corresponding to 302), a plurality of inter-layer insulating layers 541 (corresponding to 341), and a memory columnar body 505 (corresponding to 305). Now, a certain inter-layer insulating layer is assumed to be 541A, and the conductive layer disposed directly above this inter-layer insulating layer 541A is assumed to be 502A. The memory columnar body 505 includes the following, disposed from the center to the outside thereof, namely: a core insulating layer 521 (corresponding to 321); a semiconductor layer 522 (corresponding to 322); a tunnel insulating layer 524 (corresponding to 324); a charge accumulation layer 525 (corresponding to 325); a block insulating layer 526 (corresponding to 326); a block high-permittivity layer 527 (corresponding to 327A); and a cover insulating layer 529. Moreover, the memory cell array 1 includes the following outside the memory columnar body 505, disposed between the memory columnar body 505 and the conductive layer 502 so as to cover at least a side surface and a lower surface of the conductive layer 502, namely: a barrier layer 528 (corresponding to 328). Now, the cover insulating layer 529 includes a silicon oxide film formed by the likes of silicon oxide ($SiO_2$), for example. The tunnel insulating layer 524, the charge accumulation layer 525, the block insulating layer 526, and the cover insulating layer 529 inside the memory columnar body 505, and the block high-permittivity layer 527 and the barrier layer 528 outside the memory columnar body 505 are included in a multi-film layer 523 (corresponding to 323).

Now, the cover insulating layer 529 contacts the block high-permittivity layer 527. Moreover, the cover insulating layer 529 is divided at a position of the conductive layer 502 in the Z direction and is disposed only at a position of the inter-layer insulating layer 541 (corresponding to 341) in the Z direction. Therefore, the barrier layer 528 contacts the block high-permittivity layer 527 at a position of the inter-layer insulating layer 541 in the Z direction.

Next, a method of manufacturing the memory columnar body 505 and the periphery thereof, of the present embodiment, will be described in detail.

FIGS. 43 to 48 are cross-sectional views explaining manufacturing steps of the memory columnar body and the periphery thereof, in the semiconductor memory device according to the present embodiment. FIGS. 43 to 48 are cross-sectional views in the Y-Z directions of a portion shown in FIG. 42.

Up to formation of a through hole 545 (corresponding to 345) is performed in advance, similarly to in steps shown in FIGS. 9 and 10.

Figure 43:
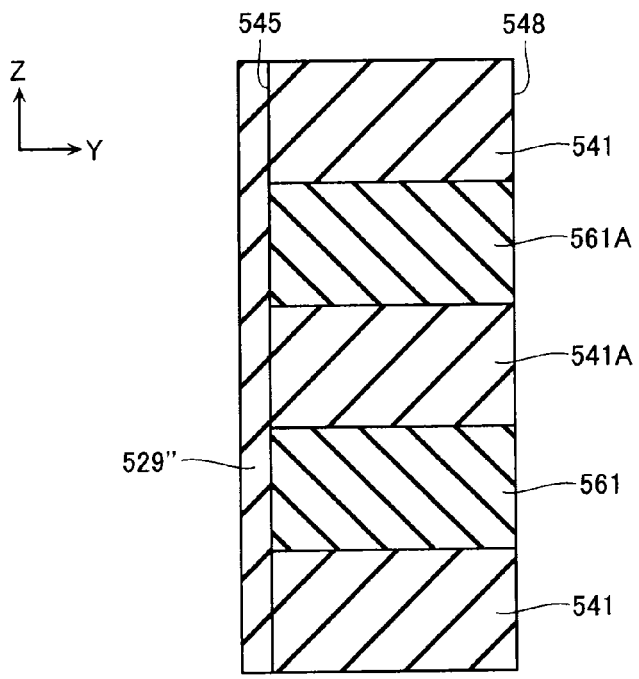
FIGS. 43 to 48 are cross-sectional views explaining manufacturing steps of the memory columnar body and the periphery thereof, in the semiconductor memory device according to the same embodiment.

As shown in FIG. 43, a cover insulating layer 529" is deposited on a side surface of the through hole 545. The cover insulating layer 529" is deposited at least from a lower surface of the inter-layer insulating layer 541A to an upper surface of a sacrifice layer 561A (corresponding to 161A) in the Z direction. The cover insulating layer 529" is formed by the likes of silicon oxide ($SiO_2$), for example.

Figure 44:
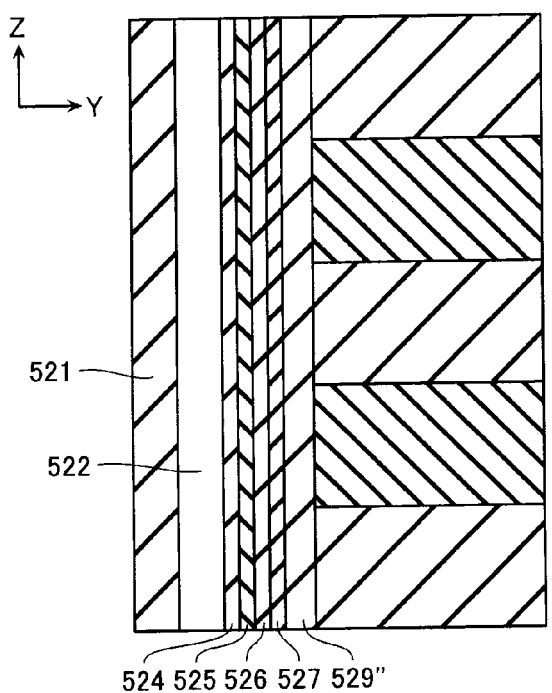

As shown in FIG. 44, the block high-permittivity layer 527, the block insulating layer 526, the charge accumulation layer 525, the tunnel insulating layer 524, the semiconductor layer 522, and the core insulating layer 521 are deposited sequentially on an inner side surface of the cover insulating layer 529".

Figure 45:
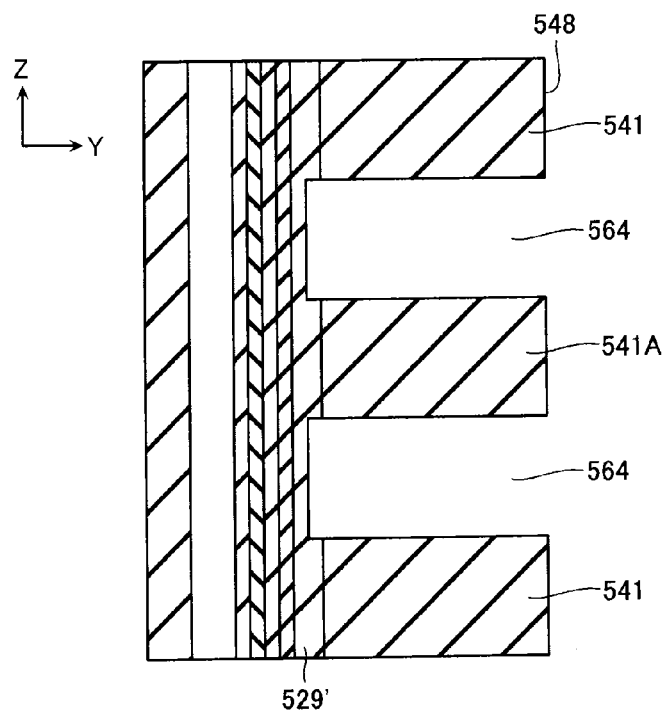

As shown in FIG. 45, the sacrifice layer 561 is removed by etching process via a trench 548 (corresponding to 348).

As a result, a gap 564 (corresponding to 364) is formed between the inter-layer insulating layers 541. At this time, a part of the cover insulating layer 529" is exposed between the inter-layer insulating layers 541, hence this exposed portion is etched to become a cover insulating layer 529'.

Figure 46:
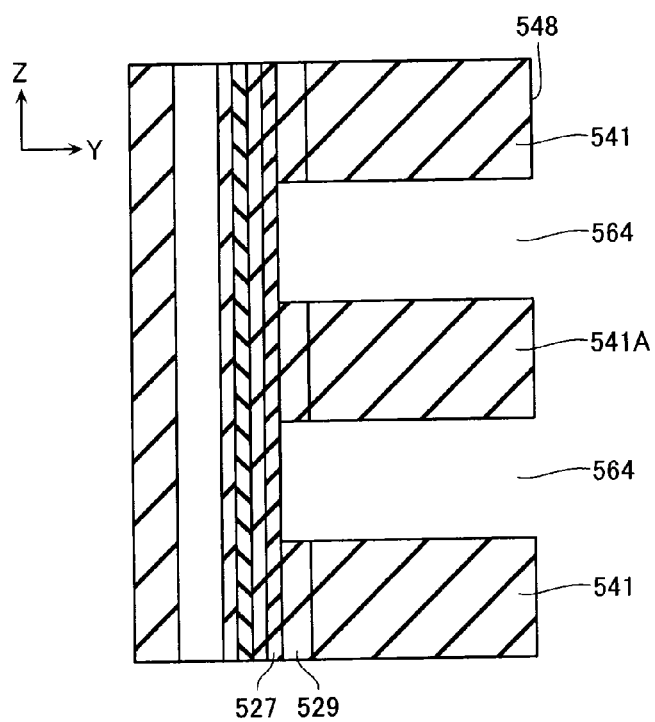

As shown in FIG. 46, the exposed portion between the inter-layer insulating layers 541 of the cover insulating layer 529' is removed via the trench 548. As a result, the cover insulating layer 529' becomes the cover insulating layer 529 divided at a position of the gap 564 in the Z direction. Moreover, the block high-permittivity layer 527 is exposed at a place of division of the cover insulating layer 529.

Figure 47:
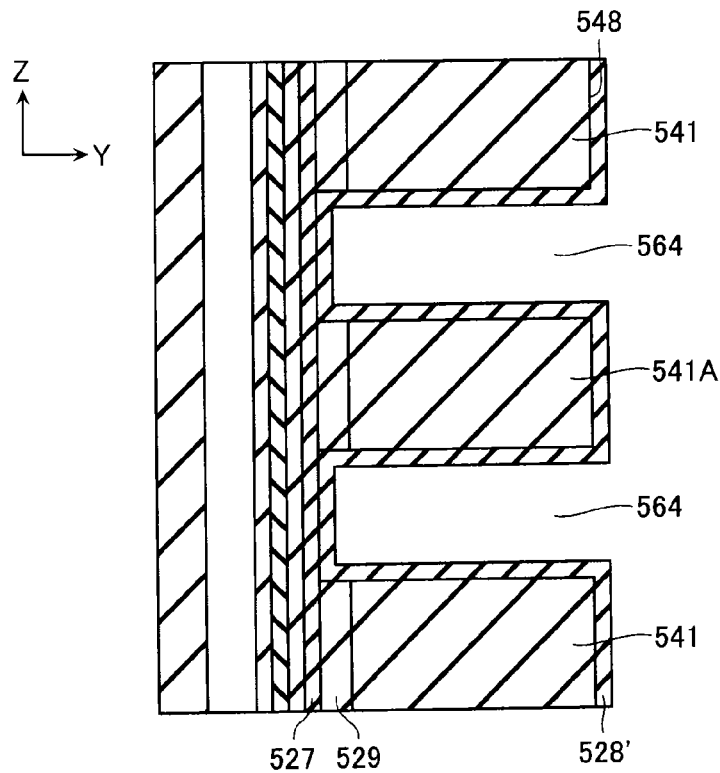

As shown in FIG. 47, a barrier layer 528' is deposited, via the trench 548, on a side surface of the inter-layer insulating layer 541 exposed in the trench 548, and lower surfaces of the inter-layer insulating layer 541 and the cover insulating layer 529 and an outer side surface of the block high-permittivity layer 527 exposed in the gap 564.

Figure 48:
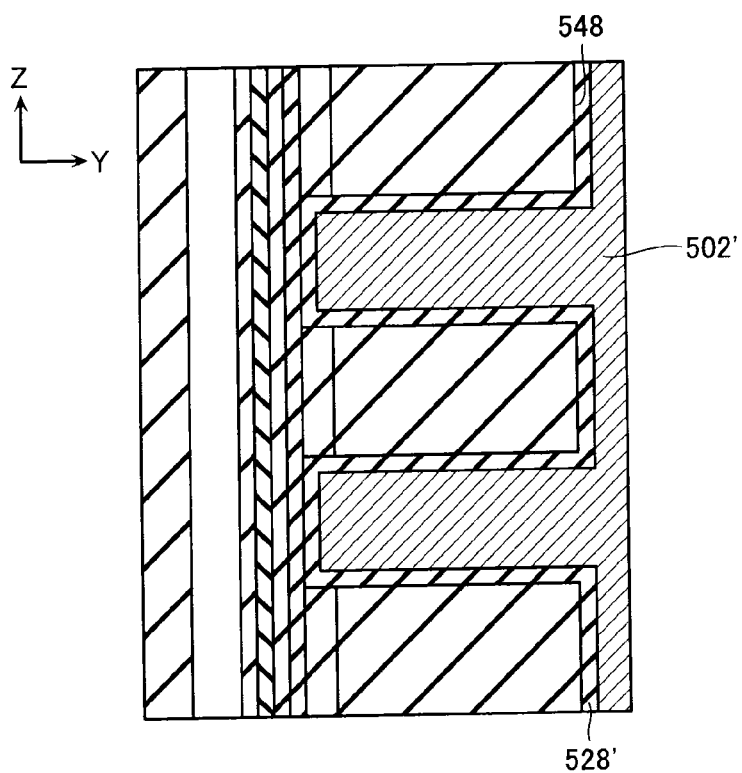

As shown in FIG. 48, the inside of the gap 564 where the barrier layer 528' is deposited is filled by a conductive layer 502', via the trench 548. Finally, parts of the barrier layer 528' and the conductive layer 502' inside the trench 548 are removed. As a result, the barrier layer 528' and the conductive layer 502' become the barrier layer 528 and the conductive layer 502.

As a result of the above steps, the memory columnar body 505 and the periphery thereof having the structure shown in FIG. 42, are formed.

As described above, the present embodiment results in a cover insulating layer 529 being deposited on an outer side surface of the block high-permittivity layer 527, whereby damage of the block high-permittivity layer 527 occurring during removal of the sacrifice layer 561 can be suppressed. This makes it possible to provide a semiconductor memory device in which there is little variation in electrical characteristics of the memory cells MC, similarly to in the above-described embodiments.

Fourth Embodiment

A fourth embodiment describes a semiconductor memory device in which the block high-permittivity layer is configured as a multi-film structure and a cover insulating layer is deposited on an outer side surface of the block high-permittivity layer. Note that here, points of difference from the third embodiment will mainly be described.

Figure 49:
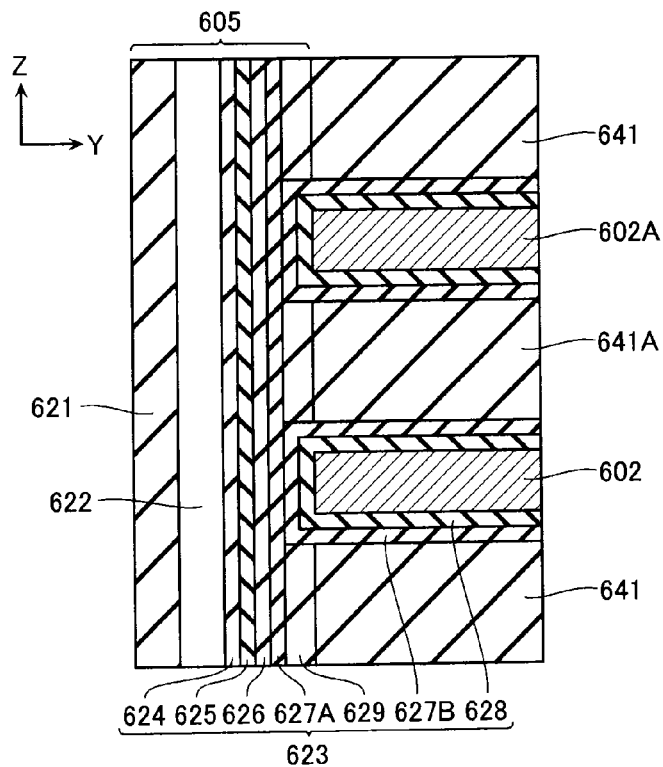
FIG. 49 is a cross-sectional view of a memory columnar body and a periphery thereof, in a semiconductor memory device according to a fourth embodiment.

FIG. 49 is a cross-sectional view of a memory columnar body and a periphery thereof, in a semiconductor memory device according to the fourth embodiment. FIG. 49 is a cross-sectional view in the Y-Z directions enlarging a portion corresponding to the portion surrounded by the dot-dash line in FIG. 5.

FIG. 49 shows a plurality of conductive layers 602 (corresponding to 502), a plurality of inter-layer insulating layers 641 (corresponding to 541), and a memory columnar body 605 (corresponding to 505). Now, a certain inter-layer insulating layer is assumed to be 641A, and the conductive layer disposed directly above this inter-layer insulating layer 641A is assumed to be 602A. The memory columnar body 605 includes the following, disposed from the center to the outside thereof, namely: a core insulating layer 621 (corresponding to 521); a semiconductor layer 622 (corresponding to 522); a tunnel insulating layer 624 (corresponding to 524); a charge accumulation layer 625 (corresponding to 525); a block insulating layer 626 (corresponding to 526); a first block high-permittivity film 627A (corresponding to 527); and a cover insulating layer 629 (corresponding to 529). Moreover, the memory cell array 1 includes the following outside the memory columnar body 605, disposed from the memory columnar body 605 to the conductive layer 602 so as to cover at least a side surface and a lower surface of the conductive layer 602, namely: a second block high-permittivity film 627B; and a barrier layer 628 (corresponding to 528). Now, the tunnel insulating layer 624, the charge accumulation layer 625, the block insulating layer 626, the first block high-permittivity film 627A, and the cover insulating layer 629 inside the memory columnar body 605, and the second block high-permittivity film 627B and the barrier layer 628 outside the memory columnar body 605 are included in a multi-film layer 623 (corresponding to 523).

Now, the first block high-permittivity film 627A is disposed so as to cover an outer side surface of the semiconductor layer 622 at least from a lower surface of the inter-layer insulating layer 641A to an upper surface of the conductive layer 602A in the Z direction. The cover insulating layer 629 contacts the first block high-permittivity film 627A. Moreover, the cover insulating layer 629 is divided at a position of the conductive layer 602 in the Z direction and is disposed only at a position of the inter-layer insulating layer 641 (corresponding to 541) in the Z direction. Therefore, the second block high-permittivity film 627B contacts the first block high-permittivity film 627A at a position of the inter-layer insulating layer 641 in the Z direction.

Next, a method of manufacturing the memory columnar body 605 and the periphery thereof, of the present embodiment, will be described in detail.

Figure 50:
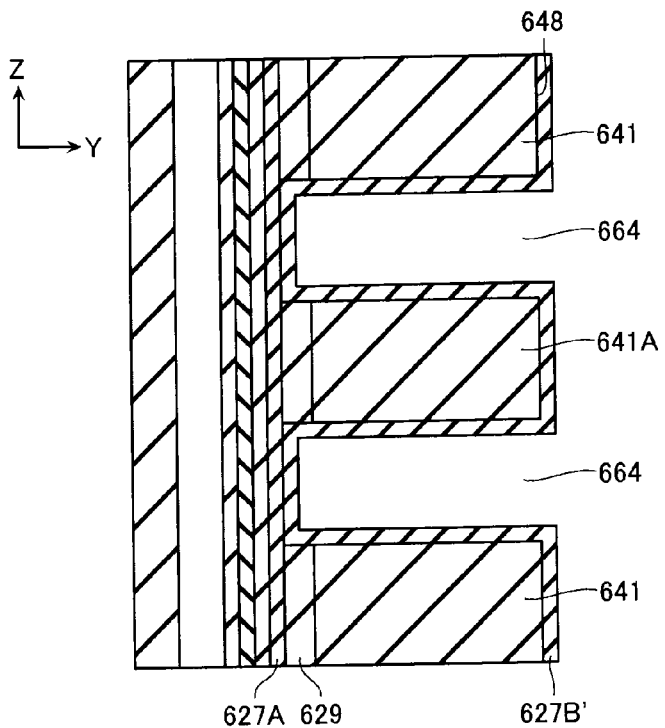
FIGS. 50 to 52 are cross-sectional views explaining manufacturing steps of the memory columnar body and the periphery thereof, in the semiconductor memory device according to the same embodiment.
Figure 51:
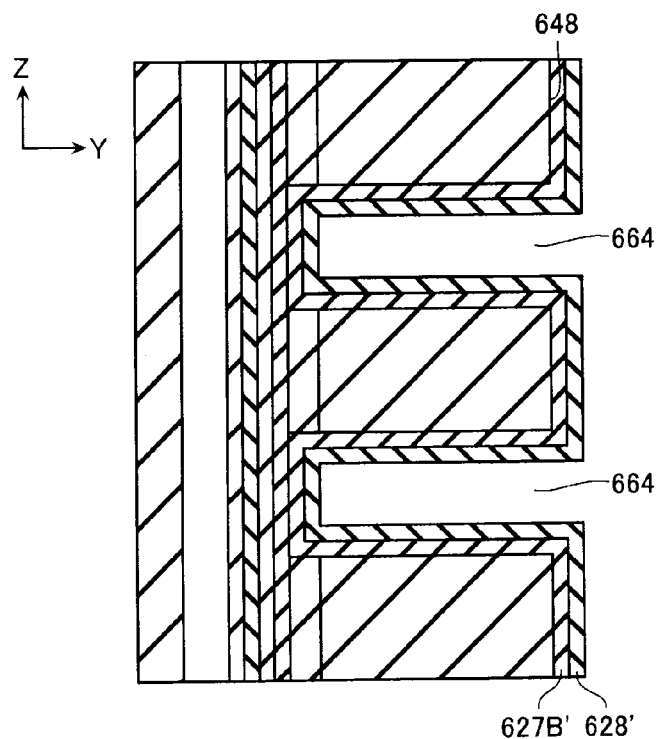
Figure 52:
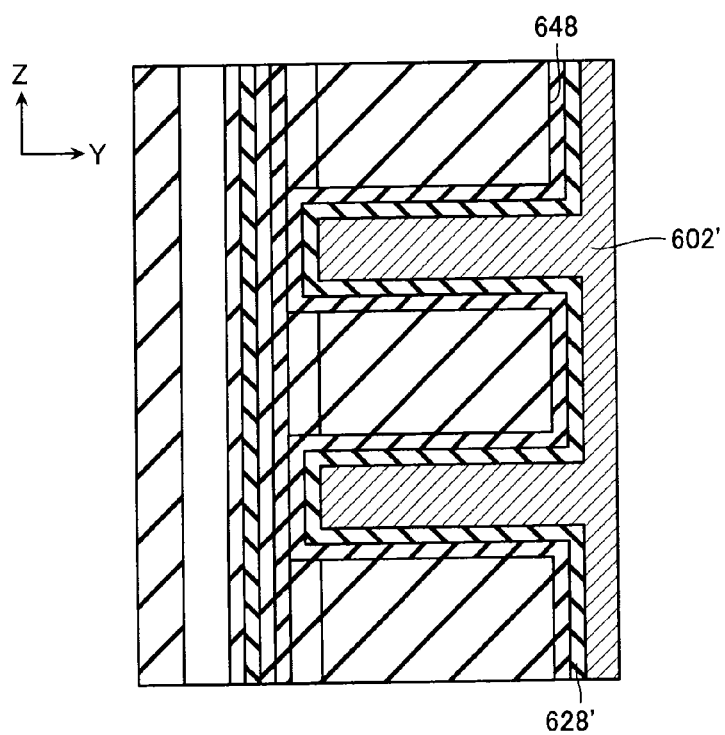

FIGS. 50 to 52 are cross-sectional views explaining manufacturing steps of the memory columnar body and the periphery thereof, in the semiconductor memory device according to the present embodiment. FIGS. 50 to 52 are cross-sectional views in the Y-Z directions of a portion shown in FIG. 49.

Up to formation of a through hole 645 (corresponding to 545) is performed in advance, similarly to in steps shown in FIGS. 9 and 10. Then, steps similar to those of FIGS. 43 to 46 are executed.

As shown in FIG. 50, a second block high-permittivity film 627B' is deposited, via a trench 648 (corresponding to 548), on a side surface of the inter-layer insulating layer 641 exposed in the trench 648, and lower surfaces of the inter-layer insulating layer 641 and the cover insulating layer 629 and an outer side surface of the first block high-permittivity film 627A exposed in a gap 664 (corresponding to 564).

As shown in FIG. 51, a barrier layer 628' is deposited, via the trench 648, on an outer surface of the second block high-permittivity film 627B' exposed in the trench 648 and the gap 664.

As shown in FIG. 52, the inside of the gap 664 where the barrier layer 628' is deposited is filled by a conductive layer 602', via the trench 648. Finally, parts of the second block high-permittivity film 627B', the barrier layer 628', and the conductive layer 602' inside the trench 648 are removed. As a result, the second block high-permittivity film 627B', the barrier layer 628', and the conductive layer 602' become the second block high-permittivity film 627B, the barrier layer 628, and the conductive layer 602.

The above steps make it possible to form the memory columnar body 605 and the periphery thereof having the structure shown in FIG. 49.

As described above, the present embodiment, similarly to the second embodiment, makes it possible for a variation in film thickness of the first block high-permittivity film 627A to be compensated by deposition of the second block high-permittivity film 627B. Furthermore, the present embodiment, similarly to the third embodiment, results in a cover insulating layer 629 being deposited on an outer side surface of the first block high-permittivity film 627A, whereby damage of the first block high-permittivity film 627A occurring during removal of the sacrifice layer 661 can be suppressed. In other words, the present embodiment makes it possible to provide a semiconductor memory device in which there is even less variation of electrical characteristics of the memory cells MC than in the second and third embodiments.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a memory cell array, the memory cell array including: a plurality of inter-layer insulating layers and a plurality of conductive layers that are stacked in plurality alternately in a first direction vertically extending above a semiconductor substrate, the conductive layers extending in a second direction crossing the first direction; a columnar semiconductor layer facing the inter-layer insulating layers and the conductive layers in the second direction and extending in the first direction; and a tunnel insulating layer, a charge accumulation layer, a block insulating layer and a block high-permittivity layer disposed between the columnar semiconductor layer and the conductive layers in the second direction,
    the block insulating layer including: a first block insulating film that covers a side surface of the columnar semiconductor layer at least from a lower surface of a first inter-layer insulating layer of the inter-layer insulating layers to an upper surface of a first conductive layer of the conductive layers in the first direction, the first conductive layer being stacked above the first inter-layer insulating layer in the first direction; and a second block insulating film that contacts the first block insulating film and covers at least a side surface and a lower surface of the conductive layer.

2. The semiconductor memory device according to claim 1, wherein
    the block high-permittivity layer is disposed between the second block insulating film and the first conductive layer, and covers the side surface and the lower surface of the first conductive layer.

3. The semiconductor memory device according to claim 2, wherein
    the memory cell array further includes a barrier layer disposed between the block high-permittivity layer and the first conductive layer and covering the side surface and the lower surface of the first conductive layer.

4. The semiconductor memory device according to claim 1, wherein
    a film thickness of the first block insulating film at a position of the first inter-layer insulating layer in the first direction is different from a film thickness of the first block insulating film at a position of the first conductive layer in the first direction.

5. The semiconductor memory device according to claim 1, wherein
the first and second block insulating films include a silicon oxide film respectively.

6. A semiconductor memory device, comprising:
a memory cell array, the memory cell array including: an inter-layer insulating layer stacked on a semiconductor substrate; a conductive layer stacked on the inter-layer insulating layer; a columnar semiconductor layer having a side surface that faces side surfaces of the inter-layer insulating layer and the conductive layer and extending in a stacking direction of the inter-layer insulating layer and the conductive layer; and a block insulating layer and a block high-permittivity layer disposed between the columnar semiconductor layer and the conductive layer,
the block high-permittivity layer including: a first block high-permittivity film that covers a side surface of the columnar semiconductor layer at least from a lower surface of the inter-layer insulating layer to an upper surface of the conductive layer in the stacking direction; and a second block high-permittivity film that contacts the first block high-permittivity film and covers at least a side surface and a lower surface of the conductive layer.

7. The semiconductor memory device according to claim 6, wherein
the memory cell array further includes a cover insulating layer disposed at a position of the inter-layer insulating layer in the stacking direction between the first block high-permittivity film and the inter-layer insulating layer.

8. The semiconductor memory device according to claim 7, wherein
the cover insulating layer contacts the first block high-permittivity film.

9. The semiconductor memory device according to claim 6, wherein
the memory cell array further includes a barrier layer disposed between the block high-permittivity layer and the conductive layer and covering the side surface and the lower surface of the conductive layer.

10. The semiconductor memory device according to claim 6, wherein
a film thickness of the first block high-permittivity film at a position of the inter-layer insulating layer in the stacking direction is different from a film thickness of the first block high-permittivity film at a position of the conductive layer in the stacking direction.

11. The semiconductor memory device according to claim 7, wherein
the cover insulating layer is separated at a position of the conductive layer in the stacking direction.

12. The semiconductor memory device according to claim 6, wherein
the first and second block high-permittivity films include an aluminum oxide film.

13. The semiconductor memory device according to claim 7, wherein
the cover insulating layer includes a silicon oxide film.

14. A semiconductor memory device, comprising:
a memory cell array, the memory cell array including: an inter-layer insulating layer stacked on a semiconductor substrate; a conductive layer stacked on the inter-layer insulating layer; a columnar semiconductor layer having a side surface that faces side surfaces of the inter-layer insulating layer and the conductive layer and extending in a stacking direction of the inter-layer insulating layer and the conductive layer; and a block insulating layer and a block high-permittivity layer disposed between the columnar semiconductor layer and the conductive layer,
the block high-permittivity layer covering a side surface of the columnar semiconductor layer at least from a lower surface of the inter-layer insulating layer to an upper surface of the conductive layer in the stacking direction, and
the memory cell array further including a cover insulating layer disposed at a position of the inter-layer insulating layer in the stacking direction between the block high-permittivity layer and the inter-layer insulating layer.

15. The semiconductor memory device according to claim 14, wherein
the cover insulating layer contacts the block high-permittivity layer.

16. The semiconductor memory device according to claim 14, wherein
the memory cell array further includes a barrier layer disposed between the block high-permittivity layer and the conductive layer and covering at least a side surface and a lower surface of the conductive layer.

17. The semiconductor memory device according to claim 14, wherein
a film thickness of the block high-permittivity layer at a position of the inter-layer insulating layer in the stacking direction is different from a film thickness of the block high-permittivity layer at a position of the conductive layer in the stacking direction.

18. The semiconductor memory device according to claim 14, wherein
the cover insulating layer is separated at a position of the conductive layer in the stacking direction.

19. The semiconductor memory device according to claim 14, wherein
the block high-permittivity layer includes an aluminum oxide film.

20. The semiconductor memory device according to claim 14, wherein
the cover insulating layer includes a silicon oxide film.

* * * * *